(12) United States Patent
Ishimaru et al.

(10) Patent No.: US 12,310,065 B2
(45) Date of Patent: May 20, 2025

(54) SEMICONDUCTOR DEVICE, SEMICONDUCTOR MEMORY DEVICE, AND METHOD FOR MANUFACTURING SEMICONDUCTOR DEVICE

(71) Applicant: Kioxia Corporation, Tokyo (JP)

(72) Inventors: Tomoki Ishimaru, Yokkaichi Mie (JP); Shinji Mori, Nagoya Aichi (JP); Kazuhiro Matsuo, Kuwana Mie (JP); Keiichi Sawa, Yokkaichi Mie (JP); Kenichiro Toratani, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 617 days.

(21) Appl. No.: 17/687,407

(22) Filed: Mar. 4, 2022

(65) Prior Publication Data

US 2023/0090044 A1 Mar. 23, 2023

(30) Foreign Application Priority Data

Sep. 21, 2021 (JP) .................................. 2021-153285

(51) Int. Cl.
*H10D 30/67* (2025.01)
*H10B 12/00* (2023.01)
*H10D 30/01* (2025.01)

(52) U.S. Cl.
CPC ......... *H10D 30/6755* (2025.01); *H10B 12/02* (2023.02); *H10B 12/30* (2023.02); *H10D 30/031* (2025.01)

(58) Field of Classification Search
CPC ............. H10D 30/6755; H10D 30/031; H10D 30/017; H10D 30/019; H10D 99/00; H10D 30/6728; H10B 12/02; H10B 12/30; H10B 12/05; H10B 12/03; H10B 12/312; H10B 12/315
See application file for complete search history.

(56) References Cited

U.S. PATENT DOCUMENTS 10,790,396 B2 9/2020 Sawabe et al.
10,943,953 B2 3/2021 Karda et al.
(Continued)

FOREIGN PATENT DOCUMENTS

| JP | 2019-169490 A | 10/2019 |
| JP | 2020-532855 A | 11/2020 |
| JP | 2020-198343 A | 12/2020 |

*Primary Examiner* — Douglas W Owens
(74) *Attorney, Agent, or Firm* — Foley & Lardner LLP

(57) ABSTRACT

A semiconductor device of an embodiment includes a first electrode, a second electrode, a first oxide semiconductor layer between the first electrode and the second electrode, the first oxide semiconductor layer containing in, Zn, and a first metal element, and the first metal element being at least one metal of Ga, Mg, or Mn, a second oxide semiconductor layer between the first oxide semiconductor layer and the second electrode, the second oxide semiconductor layer containing In, Zn, and the first metal element, a third oxide semiconductor layer between the first oxide semiconductor layer and the second oxide semiconductor layer, the third oxide semiconductor layer containing in, Zn, and a second metal element, the second metal element being at least one metal of Al, Hf, La, Sn, Ta, Ti, W, Y, or Zr, a gate electrode facing the third oxide semiconductor layer, and a gate insulating.

14 Claims, 23 Drawing Sheets

(56) References Cited

U.S. PATENT DOCUMENTS

| | | | | |
|---|---|---|---|---|
| 11,658,246 B2* | 5/2023 | Karda | ............... | H01L 29/78642 257/43 |
| 2020/0381557 A1 | 12/2020 | Hattori et al. | | |
| 2021/0305431 A1* | 9/2021 | Ishimaru | ................ | H10B 12/33 |

* cited by examiner

SEMICONDUCTOR DEVICE, SEMICONDUCTOR MEMORY DEVICE, AND METHOD FOR MANUFACTURING SEMICONDUCTOR DEVICE

CROSS-REFERENCE TO RELATED APPLICATION

This application is based upon and claims the benefit of priority from Japanese Patent Application No. 2021-153285, filed on Sep. 21, 2021, the entire contents of which are incorporated herein by reference.

FIELD

Embodiments described herein relate generally to a semiconductor device, a semiconductor memory device, and a method for manufacturing a semiconductor device.

BACKGROUND

An oxide semiconductor transistor forming a channel in an oxide semiconductor layer has excellent characteristics that a channel leakage current during an off-operation, that is, an off-leak current is extremely small. Thus, for example, the application of the oxide semiconductor transistor to a switching transistor of a memory cell of a dynamic random access memory (DRAM) has been studied.

In a case where the oxide semiconductor transistor is applied to the switching transistor of the memory cell, after a transistor structure is formed, a heat treatment accompanying the formation of the memory cell and a wiring is performed. Accordingly, it is expected to realize an oxide semiconductor transistor with little fluctuation in characteristics after the heat treatment and high heat resistance.

DETAILED DESCRIPTION

Figure 1:
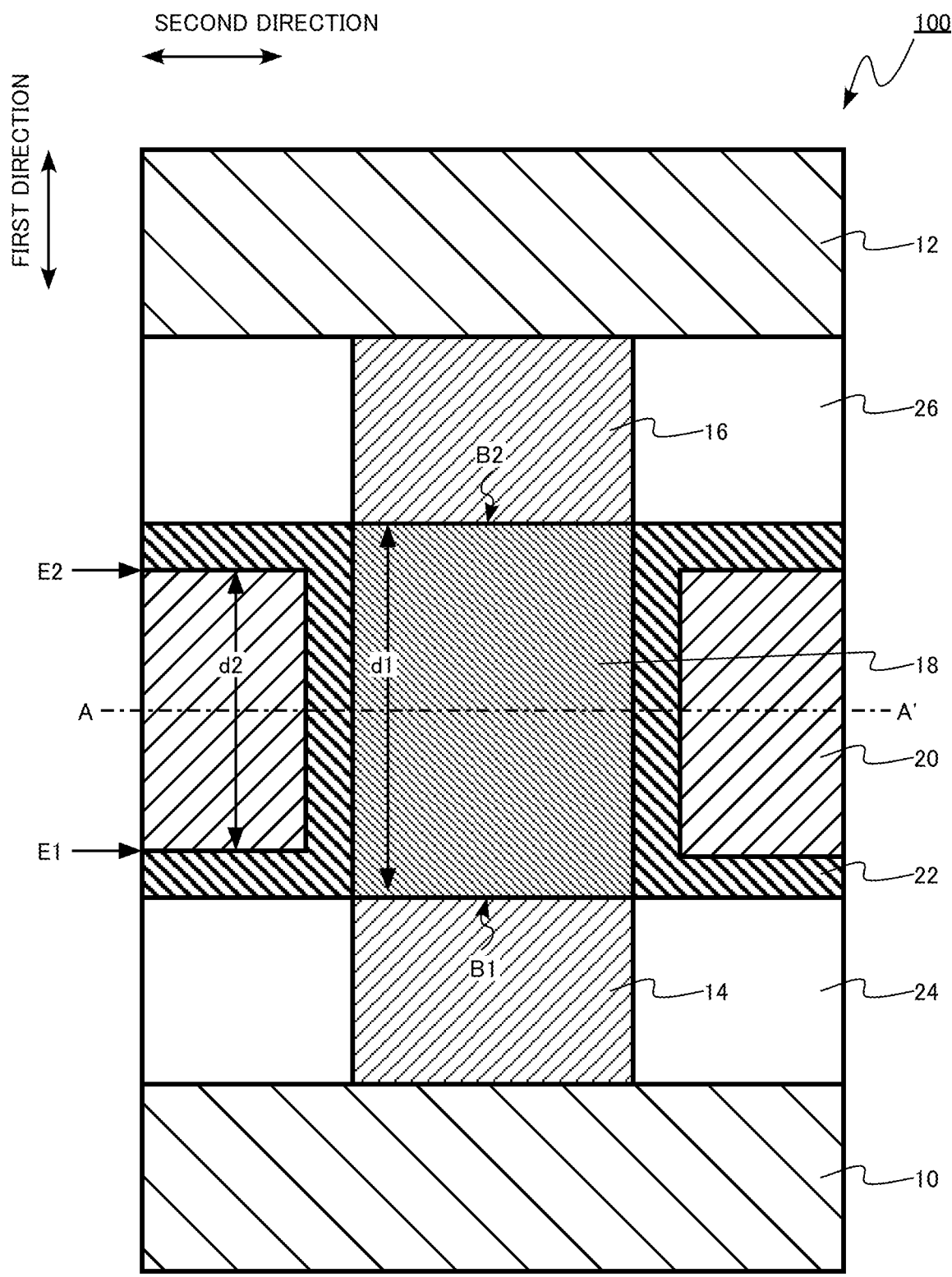
FIG. 1 is a schematic cross-sectional view of a semiconductor device of a first embodiment.

A semiconductor device of an embodiment includes a first electrode, a second electrode, a first oxide semiconductor layer provided between the first electrode and the second electrode, the first oxide semiconductor layer containing indium (In), zinc (Zn), and a first metal element, and the first metal element being at least one metal element selected from the group consisting of gallium (Ga), magnesium (Mg), and manganese (Mn), a second oxide semiconductor layer provided between the first oxide semiconductor layer and the second electrode, the second oxide semiconductor layer containing indium (In), zinc (Zn), and the first metal element, a third oxide semiconductor layer provided between the first oxide semiconductor layer and the second oxide semiconductor layer, the third oxide semiconductor layer having a chemical composition different from chemical compositions of the first oxide semiconductor layer and the second oxide semiconductor layer, the third oxide semiconductor layer containing indium (In), zinc (Zn), and a second metal element, the second metal element being at least one metal element selected from the group consisting of aluminum (Al), hafnium (Hf), lanthanum (La), tin (Sn), tantalum (Ta), titanium (Ti), tungsten (W), yttrium (Y), and zirconium (Zr), a gate electrode facing the third oxide semiconductor layer, and a gate insulating layer provided between the third oxide semiconductor layer and the gate electrode.

Hereinafter, embodiments of the present disclosure will be described with reference to the drawings. In the following description, the same or similar members will be denoted by the same reference numerals, and the description of the members once described will be appropriately omitted.

In the present specification, the term "upper" or "lower" may be used for the sake of convenience. The term "upper" or "lower" is merely a term indicating a relative positional relationship in the drawings, and is not a term defining a positional relationship with respect to gravity.

Qualitative analysis and quantitative analysis of a chemical composition of members constituting a semiconductor device and a semiconductor memory device in the present specification can be performed by, for example, secondary ion mass spectrometry (SIMS), energy dispersive X-ray spectroscopy (EDX), or Rutherford back-scattering spectroscopy (RES). For example, thicknesses of the members constituting the semiconductor device and the semiconductor memory device, a distance between the members, and the like can be measured by a transmission electron microscope (TEM). Electrical resistance of the members constituting the semiconductor device and the semiconductor memory device can be measured by, for example, scanning spreading resistance microscopy (SSRM).

First Embodiment

A semiconductor device of a first embodiment includes a first electrode, a second electrode, a first oxide semiconductor layer provided between the first electrode and the second electrode, the first oxide semiconductor layer containing indium (In), zinc (Zn), and a first metal element, and the first metal element being at least one metal element selected from the group consisting of gallium (Ga), magnesium (Mg), and manganese (Mn), a second oxide semiconductor layer provided between the first oxide semiconductor layer and the second electrode, the second oxide semiconductor layer containing indium (In), zinc (Zn), and the first metal element, a third oxide semiconductor layer provided between the first oxide semiconductor layer and the second oxide semiconductor layer, the third oxide semiconductor layer having a chemical composition different from chemical compositions of the first oxide semiconductor layer and the second oxide semiconductor layer, the third oxide semiconductor layer containing indium (In), zinc (Zn), and a second metal element, the second metal element being at least one metal element selected from the group consisting of aluminum (Al), hafnium (Hf), lanthanum (La), tin (Sn), tantalum (Ta), titanium (Ti), tungsten (W), yttrium (Y), and zirconium (Zr), a gate electrode facing the third oxide semiconductor layer, and a gate insulating layer provided between the third oxide semiconductor layer and the gate electrode.

Figure 2:
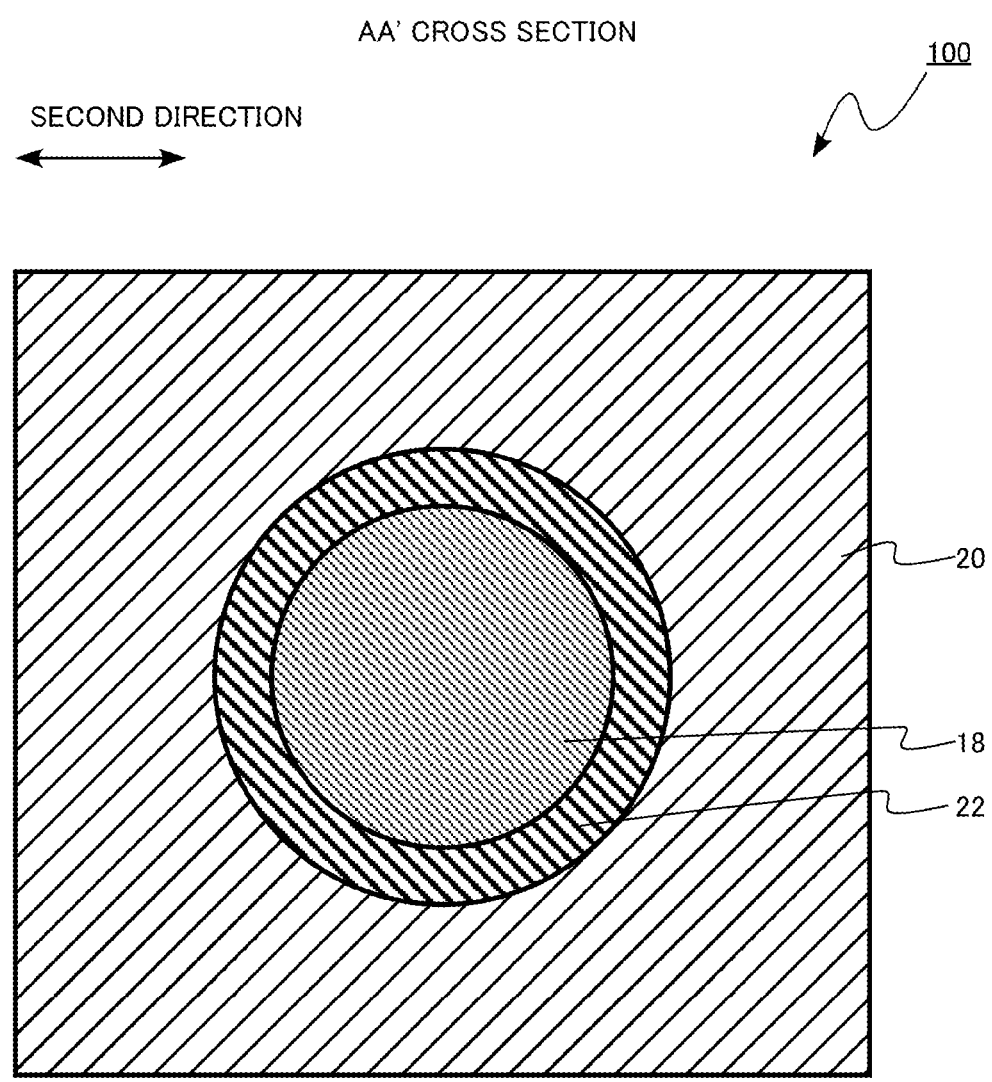
FIG. 2 is a schematic cross-sectional view of the semiconductor device of the first embodiment.

FIGS. 1 and 2 are schematic cross-sectional views of a semiconductor device of a first embodiment. FIG. 2 is a cross-sectional view taken along a line AA' of FIG. 1.

The semiconductor device of the first embodiment is a transistor 100. The transistor 100 is an oxide semiconductor transistor in which a channel is formed in an oxide semiconductor. A gate electrode of the transistor 100 surrounds an oxide semiconductor on which the channel is formed. The transistor 100 is a transistor having a so-called gate all around (GAA) structure. The transistor 100 is a so-called vertical transistor.

The transistor 100 includes a source electrode 10, a drain electrode 12, a source layer 14, a drain layer 16, a channel layer 18, a gate electrode 20, a gate insulating layer 22, a first interlayer insulating layer 24, and a second interlayer insulating layer 26.

Hereinafter, a direction from the source electrode 10 toward the drain electrode 12 is defined as a first direction.

A direction perpendicular to the first direction is defined as a second direction. For example, in FIG. 1, a vertical direction is the first direction, and a horizontal direction is the second direction.

The source electrode 10 is an example of a first electrode. The drain electrode 12 is an example of a second electrode. The source layer 14 is an example of a first oxide semiconductor layer. The drain layer 16 is an example of a second oxide semiconductor layer. The channel layer 18 is an example of a third oxide semiconductor layer.

The source electrode 10 is a conductive layer. The source electrode 10 is, for example, metal or a metal compound. The source electrode 10 contains, for example, indium (In), tin (Sn), and oxygen (O). The source electrode 10 contains, for example, indium tin oxide. The source electrode 10 is, for example, indium tin oxide.

The drain electrode 12 is a conductive layer. The drain electrode 12 is, for example, metal or a metal compound. The drain electrode 12 contains, for example, indium (In), tin (Sn), and oxygen (O). The drain electrode 12 contains, for example, indium tin oxide. The drain electrode 12 is, for example, indium tin oxide.

The source layer 14 is provided between the source electrode 10 and the drain electrode 12. For example, the source layer 14 and the source electrode 10 are in contact with each other. The source layer 14 and the source electrode 10 are electrically connected.

The source layer 14 is an oxide semiconductor. The source layer 14 contains indium (In), zinc (Zn), a first metal element, and oxygen (O). The first metal element is at least one metal element selected from the group consisting of gallium (Ga), magnesium (Mg), and manganese (Mn).

For example, the source layer 14 contains, as main components, indium (In), zinc (Zn), and a first metal element. The source layer 14 containing, as main components, indium (In), zinc (Zn), and a first metal element means that an element having an atomic concentration higher than an atomic concentration of indium (In), zinc (Zn), or the first metal element is not present in the source layer 14 in addition to oxygen (O).

The source layer 14 contains, for example, indium (In), zinc (Zn), gallium (Ga), and oxygen (O). For example, the source layer 14 contains, as main components, indium (In), zinc (Zn), and gallium (Ga).

The source layer 14 has, for example, a cylindrical shape. A length of the source layer 14 in the first direction is, for example, equal to or more than 10 nm and equal to or less than 50 nm.

The drain layer 16 is provided between the source layer 14 and the drain electrode 12. For example, the drain layer 16 is in contact with the drain electrode 12. The drain layer 16 is electrically connected to the drain electrode 12.

The drain layer 16 is an oxide semiconductor. The drain layer 16 contains indium (In), zinc (Zn), a first metal element, and oxygen (O). The first metal element is at least one metal element selected from the group consisting of gallium (Ga), magnesium (Mg), and manganese (Mn).

For example, the drain layer 16 contains, as main components, indium (In), zinc (Zn), and a first metal element. The drain layer 16 containing, as main components, indium (In), zinc (Zn), and a first metal element means that an element having an atomic concentration higher than an atomic concentration of indium (In), zinc (Zn), or the first metal element is not present in the drain layer 16 in addition to oxygen (O).

The drain layer 16 contains, for example, indium (In), zinc (Zn), gallium (Ga), and oxygen (O). For example, the drain layer 16 contains, as main components, indium (In), zinc (Zn), and gallium (Ga).

The drain layer 16 contains the same first metal element as the first metal element of the source layer 14. For example, the drain layer 16 and the source layer 14 are formed by using the same oxide semiconductor. For example, a chemical composition of the drain layer 16 and a chemical composition of the source layer 14 are the same.

The drain layer 16 has, for example, a cylindrical shape. A length of the drain layer 16 in the first direction is, for example, equal to or more than 10 nm and equal to or less than 50 nm.

The channel layer 18 is provided between the source layer 14 and the drain layer 16. The channel layer 18 is in contact with the source layer 14 and the drain layer 16.

In the channel layer 18, a channel serving as a current path is formed when the transistor 100 is turned on. The channel layer 18 extends in the direction from the source electrode 10 toward the drain electrode 12, that is, in the first direction. When the transistor 100 is turned on, a current flows in the channel layer 18 in the first direction.

The channel layer 18 is, for example, a cylindrical shape.

The channel layer 18 is an oxide semiconductor. The channel layer 18 contains indium (In), zinc (Zn), a second metal element, and oxygen (O). The second metal element is at least one metal element selected from the group consisting of aluminum (Al), hafnium (Hf), lanthanum (La), tin (Sn), tantalum (Ta), titanium (Ti), tungsten (W), yttrium (Y), and zirconium (Zr).

For example, the channel layer 18 contains, as main components, indium (In), zinc (Zn), and a second metal element. The channel layer 18 contains, as main components, indium (In), zinc (Zn), and a second metal element means that an element having an atomic concentration higher than an atomic concentration of indium (In), zinc (Zn), or the second metal element is not present in the channel layer 18 in addition to oxygen (O).

The channel layer 18 contains, for example, indium (In), zinc (Zn), aluminum (Al), and oxygen (O). For example, the channel layer 18 contains, as main components, indium (In), zinc (Zn), and aluminum (Al).

A chemical composition of the channel layer 18 is different from a chemical composition of the source layer 14. The chemical composition of the channel layer 18 is different from the chemical composition of the drain layer 16.

An atomic concentration of the first metal element in the channel layer 18 is, for example, lower than an atomic concentration of the first metal element in the source layer 14. For example, the atomic concentration of the first metal element in the channel layer 18 is lower than an atomic concentration of the first metal element in the drain layer 16.

For example, the atomic concentration of the first metal element in the channel layer 18 is equal to or less than 1/10 of the atomic concentration of the first metal element in the source layer 14. For example, the atomic concentration of the first metal element in the channel layer 18 is equal to or less than 1/10 of the atomic concentration of the first metal element in the drain layer 16.

For example, an atomic concentration of the second metal element in the channel layer 18 is higher than an atomic concentration of the second metal element in the source layer 14. For example, the atomic concentration of the second metal element in the channel layer 18 is higher than an atomic concentration of the second metal element in the drain layer 16.

For example, the atomic concentration of the second metal element in the channel layer 18 is equal to or more than 10 times the atomic concentration of the second metal element in the source layer 14. The atomic concentration of the second metal element in the channel layer 18 is equal to or more than 10 times the atomic concentration of the second metal element in the drain layer 16.

A length (d1 in FIG. 1) of the channel layer 18 in the first direction is, for example, equal to or more than 20 nm and equal to or less than 100 nm. The length (d1 in FIG. 1) of the channel layer 18 in the first direction is, for example, larger than a length (d2 in FIG. 1) of the gate electrode 20 in the first direction.

The gate electrode 20 is provided to face the channel layer 18. For example, the gate electrode 20 is provided to surround the channel layer 18. For example, the gate electrode 20 is provided around the channel layer 18.

The gate electrode 20 is, for example, metal, a metal compound, or a semiconductor. The gate electrode 20 contains, for example, tungsten (W).

A length (d2 in FIG. 1) of the gate electrode 20 in the first direction is, for example, equal to or more than 20 nm and equal to or less than 100 nm. The length d2 of the gate electrode 20 in the first direction is a gate length of the transistor 100.

For example, a boundary (B1 in FIG. 1) between the source layer 14 and the channel layer 18 is disposed closer to the source electrode 10 than the gate electrode 20 in the first direction. In other words, the boundary B1 between the source layer 14 and the channel layer 18 is disposed closer to the source electrode 10 than an end (E1 in FIG. 1) of the gate electrode 20 close to the source electrode 10 in the first direction.

For example, a boundary (B2 in FIG. 1) between the drain layer 16 and the channel layer 18 is disposed closer to the drain electrode 12 than the gate electrode 20 in the first direction. In other words, the boundary B2 between the drain layer 16 and the channel layer 18 is disposed closer to the drain electrode 12 than an end (E2 in FIG. 1) of the gate electrode 20 close to the drain electrode 12 in the first direction.

For example, a position of the boundary B1 between the source layer 14 and the channel layer 18 is defined as follows. A concentration profile of the second metal element along the first direction from the channel layer 18 toward the source layer 14 is acquired. A position where a concentration of the second metal element is 1/10 of a maximum concentration of the second metal element is defined as a position of the boundary between the source layer 14 and the channel layer 18.

Similarly, for example, the boundary B2 between the drain layer 16 and the channel layer 18 is defined as follows. A concentration profile of the second metal element along the first direction from the channel layer 18 toward the drain layer 16 is acquired. A position where a concentration of the second metal element is 1/10 of a maximum concentration of the second metal element is defined as a position of the boundary between the source layer 14 and the channel layer 18.

The gate insulating layer 22 is provided between the channel layer 18 and the gate electrode 20. For example, the gate insulating layer 22 is provided to surround the channel layer 18.

The gate insulating layer 22 is, for example, an oxide or an oxynitride. The gate insulating layer 22 contains, for example, a silicon oxide or an aluminum oxide. A thickness of the gate insulating layer 22 is, for example, equal to or more than 2 nm and equal to or less than 10 nm.

The first interlayer insulating layer 24 is provided between the source electrode 10 and the gate electrode 20. For example, the first interlayer insulating layer 24 is provided around the source layer 14.

The first interlayer insulating layer 24 is, for example, an oxide, a nitride, or an oxynitride. The first interlayer insulating layer 24 contains, for example, a silicon oxide.

The second interlayer insulating layer 26 is provided between the drain electrode 12 and the gate electrode 20. For example, the second interlayer insulating layer 26 is provided around the drain layer 16.

The second interlayer insulating layer 26 is, for example, an oxide, an oxynitride, or a nitride. The second interlayer insulating layer 26 contains, for example, a silicon oxide.

Next, an example of a method for manufacturing a semiconductor device of the first embodiment will be described.

A method for manufacturing a semiconductor device of the first embodiment includes forming a first insulating film on a first conductive film, forming a second insulating film on the first insulating film, forming a third insulating film on the second insulating film, forming an opening penetrating the third insulating film, the second insulating film, and the first insulating film and reaches the first conductive film, forming a first oxide semiconductor film containing indium (In), zinc (Zn), and a first metal element in the opening, the first metal element being at least one metal element selected from the group consisting of gallium (Ga), magnesium (Mg), and manganese (Mn), removing the first oxide semiconductor film on the third insulating film, forming a second conductive film on the first oxide semiconductor film and the third insulating film, selectively removing the second insulating film from the first insulating film and the third insulating film to expose the first oxide semiconductor film, removing a part of the first oxide semiconductor film, forming a second oxide semiconductor film having a chemical composition different from a chemical composition of the first oxide semiconductor film, the second oxide semiconductor film containing indium (In), zinc (Zn), and a second metal element in a region in which a part of the first oxide semiconductor film is removed, and the second metal element being at least one metal element selected from the group consisting of aluminum (Al), hafnium (Hf), lanthanum (La), tin (Sn), tantalum (Ta), titanium (Ti), tungsten (W), yttrium (Y), and zirconium (Zr), removing a part of the second oxide semiconductor film, forming a fourth insulating film on the second oxide semiconductor film, and forming a metal film on the fourth insulating film.

FIGS. 3, 4, 5, 6, 7, S, 9, 10, 11, 12, and 13 are schematic cross-sectional views illustrating the method for manufacturing the semiconductor device of the first embodiment. FIGS. 3 to 13 illustrate cross sections corresponding to FIG. 1.

Figure 3:
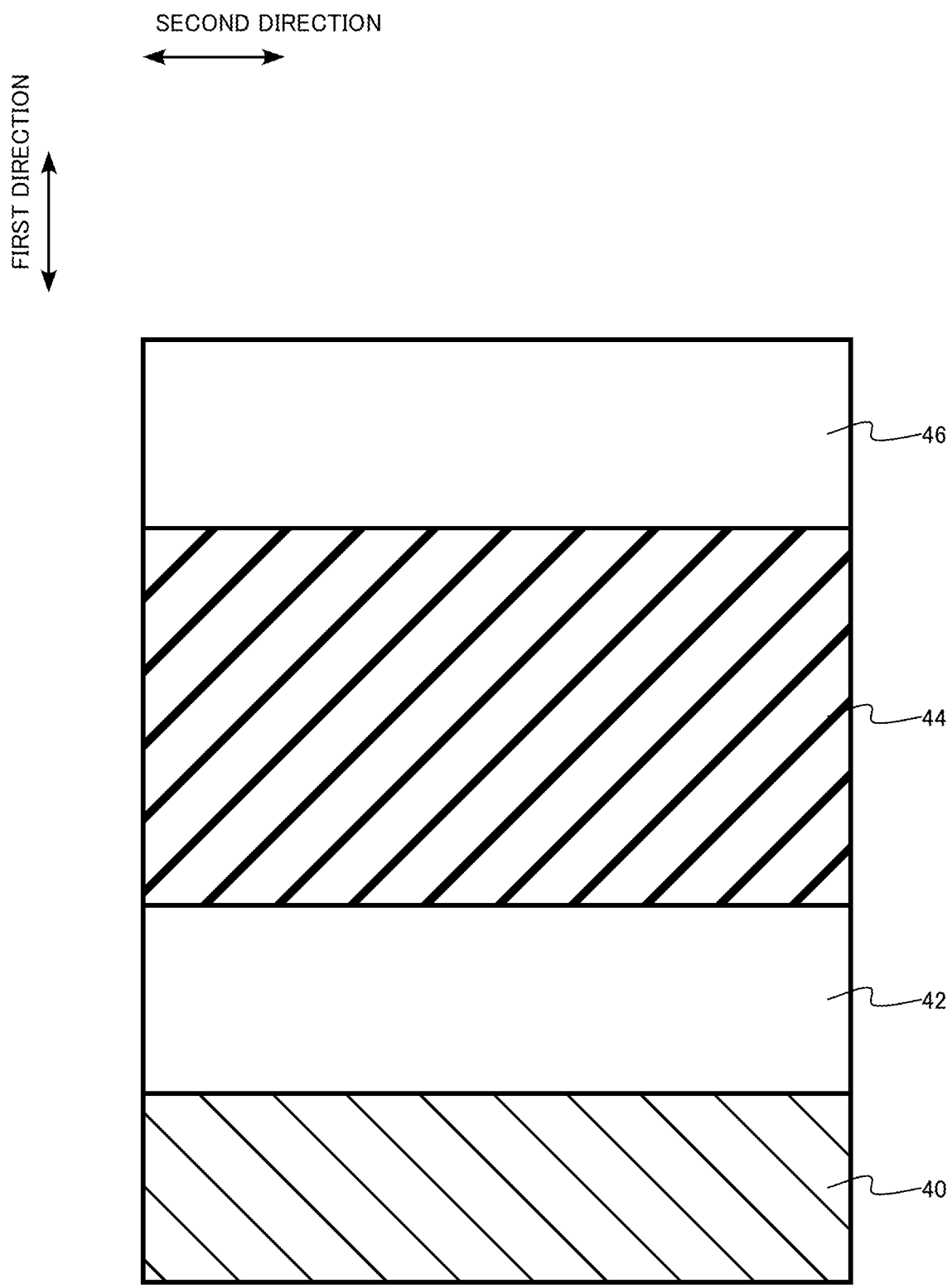
FIG. 3 is a schematic cross-sectional view illustrating a method for manufacturing the semiconductor device of the first embodiment.

Initially, a first silicon oxide film 42 is formed on a first indium tin oxide film 40. Subsequently, a silicon nitride film 44 is formed on the first silicon oxide film 42. Subsequently, a second silicon oxide film 46 is formed on the silicon nitride film 44 (FIG. 3). The first indium tin oxide film 40, the first silicon oxide film 42, the silicon nitride film 44, and the second silicon oxide film 46 are formed by, for example, a chemical vapor deposition method (CVD method).

The first indium tin oxide film 40 is an example of a first conductive film. The first silicon oxide film 42 is an example of a first insulating film. The silicon nitride film 44 is an example of a second insulating film. The second silicon oxide film 46 is an example of a third insulating film.

Figure 4:
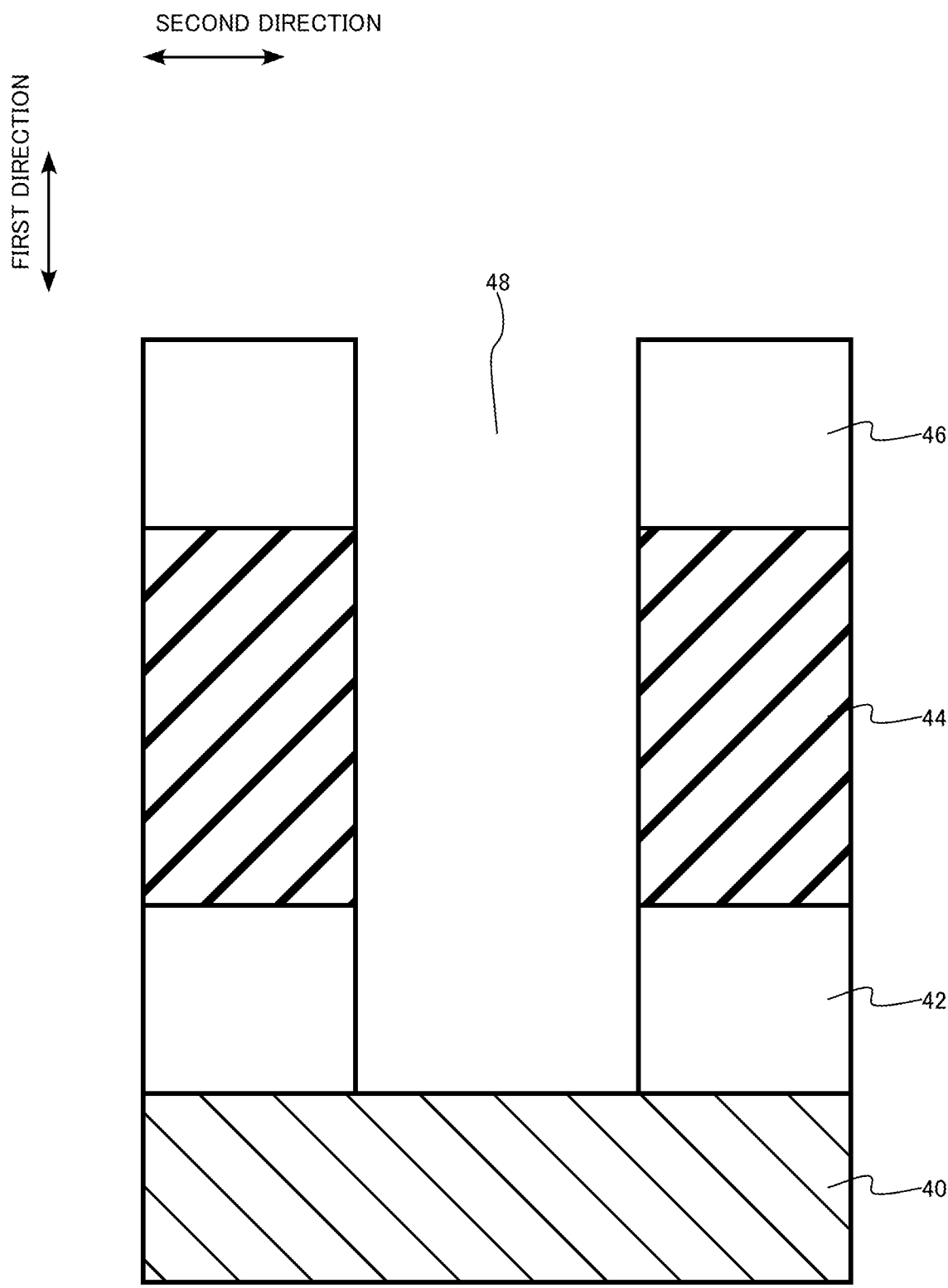
FIG. 4 is a schematic cross-sectional view illustrating the method for manufacturing the semiconductor device of the first embodiment.

Subsequently, an opening 48 that penetrates the second silicon oxide film 46, the silicon nitride film 44, and the first silicon oxide film 42 from a surface of the second silicon oxide film 46 and reaches the first indium tin oxide film 40 is formed (FIG. 4). The opening 48 is formed by using, for example, a lithography method and a reactive ion etching method (RIE method).

Figure 5:
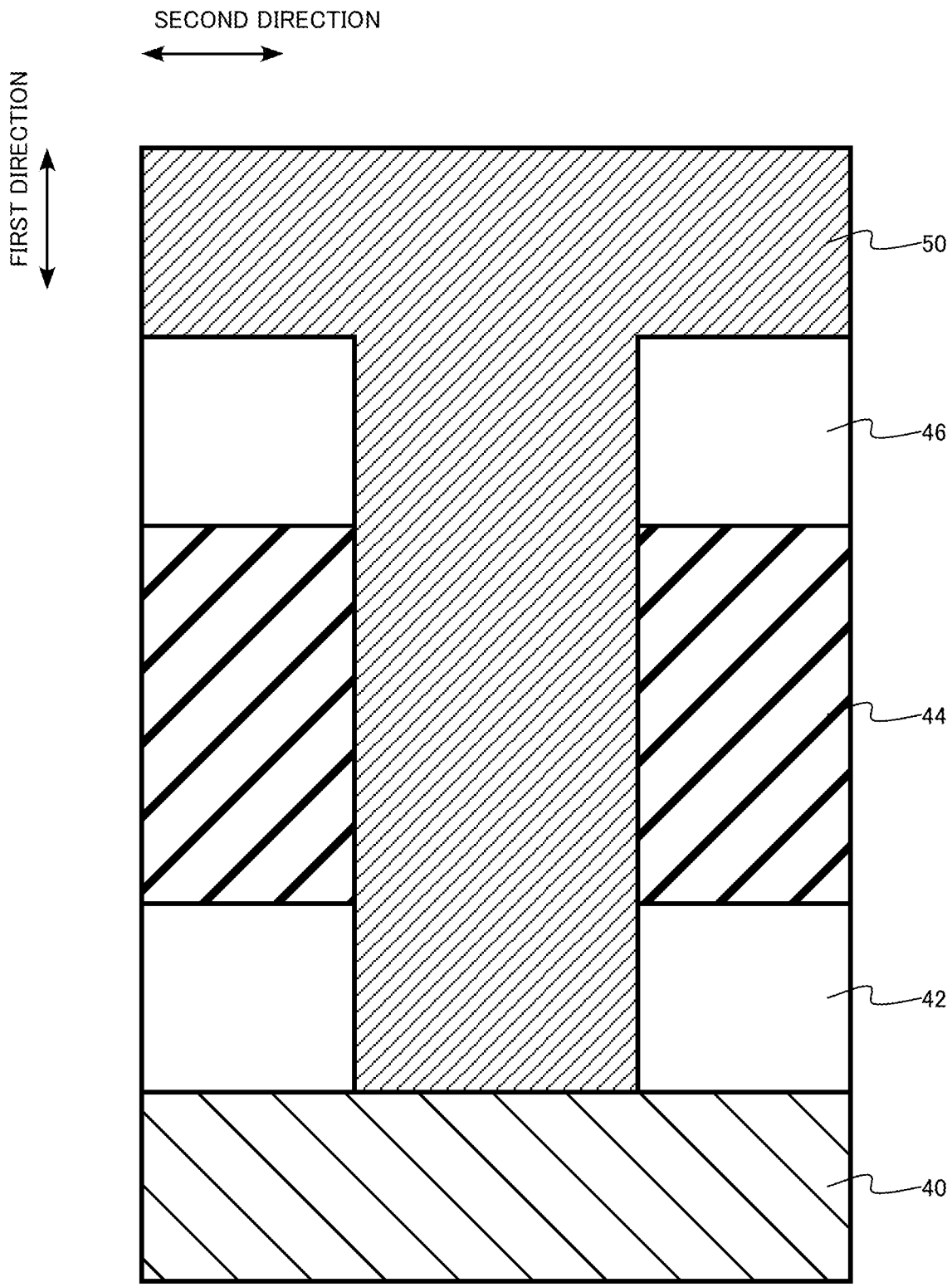
FIG. 5 is a schematic cross-sectional view illustrating the method for manufacturing the semiconductor device of the first embodiment.

Subsequently, a first oxide semiconductor film 50 is formed in the opening 48 (FIG. 5). The opening 48 is filled with the first oxide semiconductor film 50. The first oxide semiconductor film 50 contains indium (In), zinc (Zn), and a first metal element, and the first metal element is at least one metal element selected from the group consisting of gallium (Ga), magnesium (Mg), and manganese (Mn). The first oxide semiconductor film 50 contains, for example, indium (In), zinc (Zn), and gallium (Ga).

Figure 6:
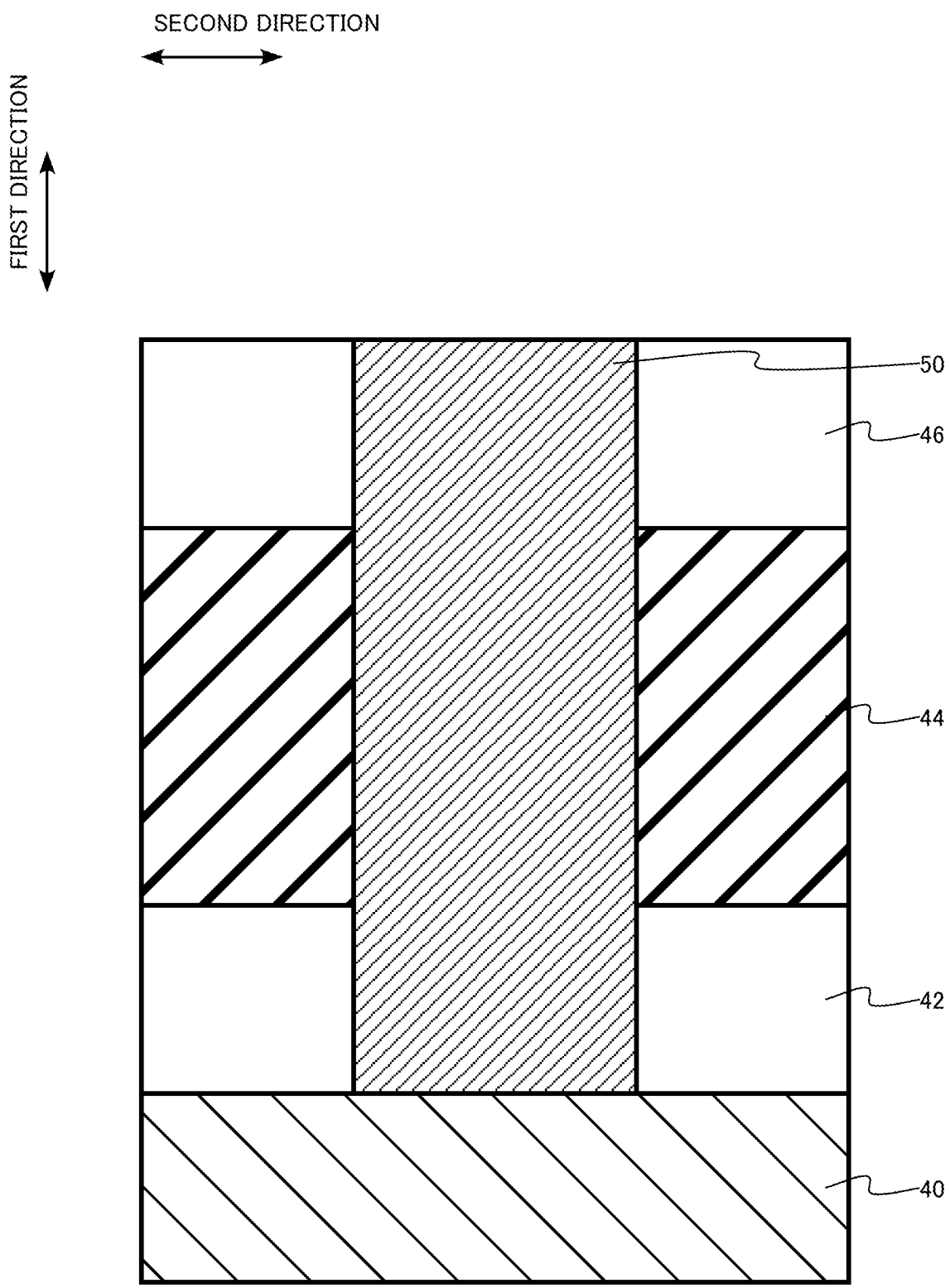
FIG. 6 is a schematic cross-sectional view illustrating the method for manufacturing the semiconductor device of the first embodiment.

Subsequently, the first oxide semiconductor film 50 on the second silicon oxide film 46 is removed (FIG. 6). The first oxide semiconductor film 50 is removed by, for example, the RIE method.

Figure 7:
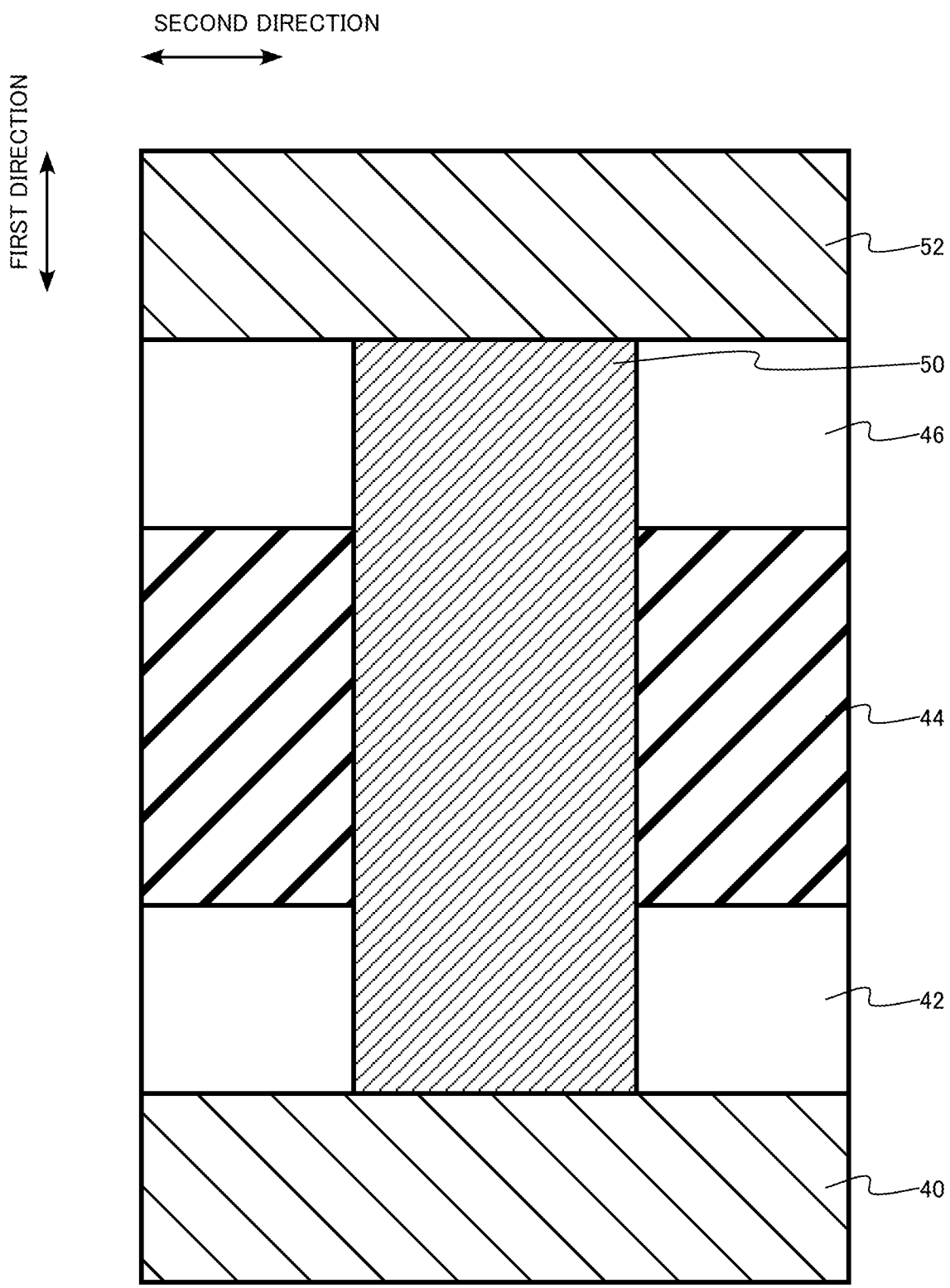
FIG. 7 is a schematic cross-sectional view illustrating the method for manufacturing the semiconductor device of the first embodiment.

Subsequently, a second indium tin oxide film 52 is formed on the first oxide semiconductor film 50 and the second silicon oxide film 46 (FIG. 7). The second indium tin oxide film 52 is formed by, for example, the CVD method. The second indium tin oxide film 52 is an example of a second conductive film.

Figure 8:
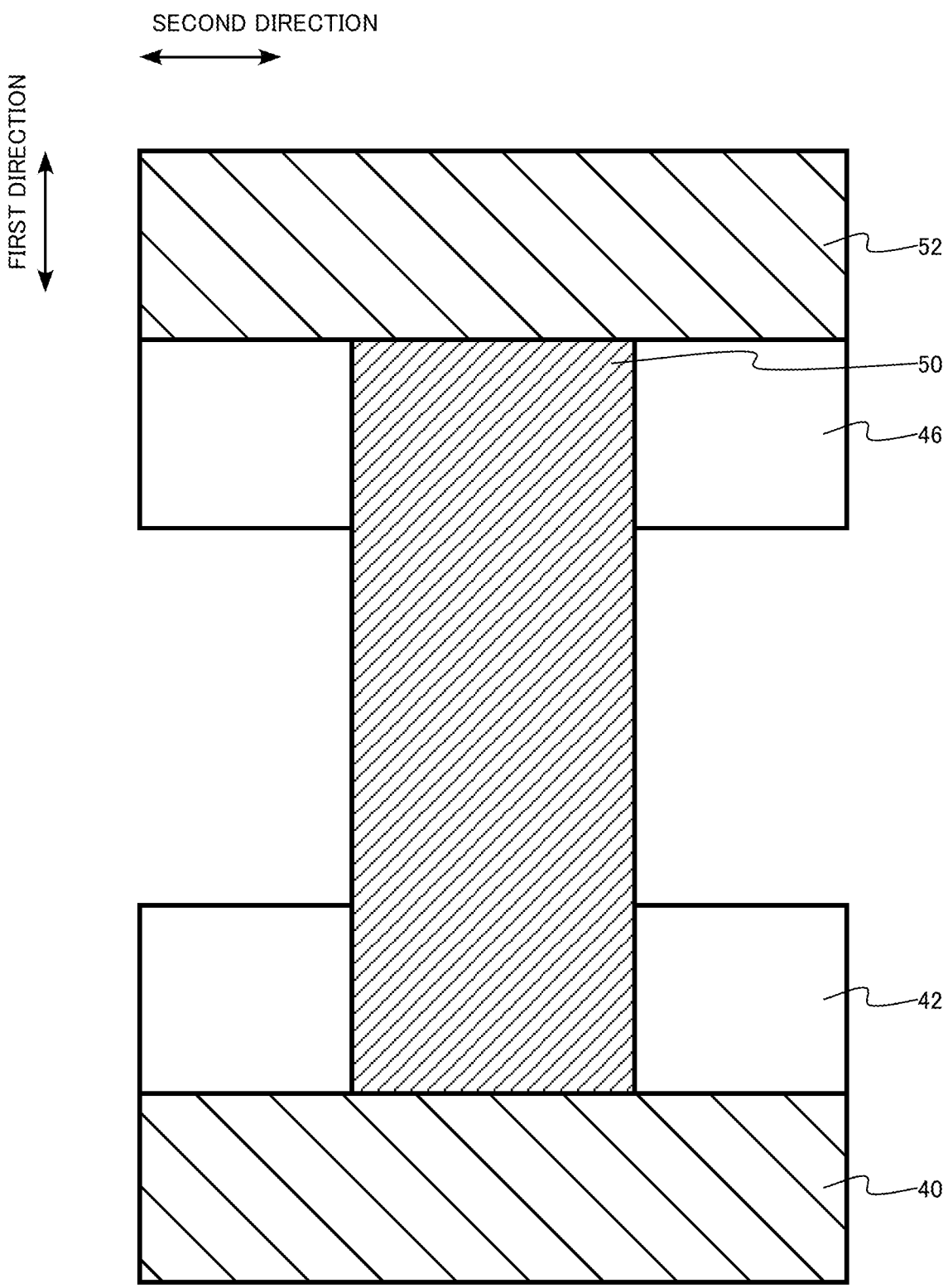
FIG. 8 is a schematic cross-sectional view illustrating the method for manufacturing the semiconductor device of the first embodiment.

Subsequently, the silicon nitride film 44 is selectively removed from the first silicon oxide film 42 and the second silicon oxide film 46, and the first oxide semiconductor film 50 formed in the opening 48 is exposed (FIG. 8). The silicon nitride film 44 is removed, for example, by supplying a wet etching solution from an opening formed in a region (not illustrated).

Figure 9:
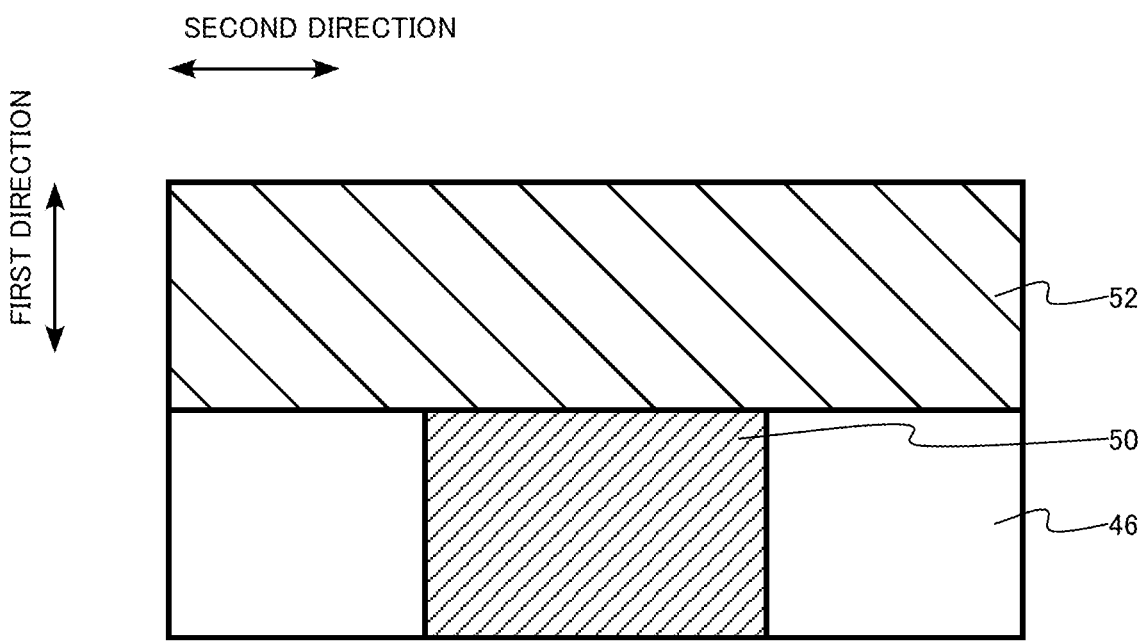
FIG. 9 is a schematic cross-sectional view illustrating the method for manufacturing the semiconductor device of the first embodiment.
Figure 9:
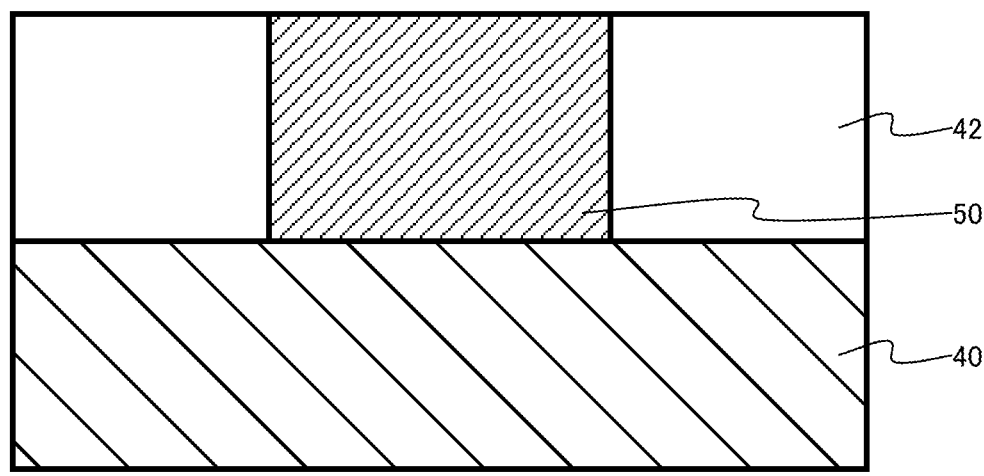

Subsequently, a part of the first oxide semiconductor film 50 is removed (FIG. 9). The first oxide semiconductor film 50 is removed by, for example, a wet etching method.

Figure 10:
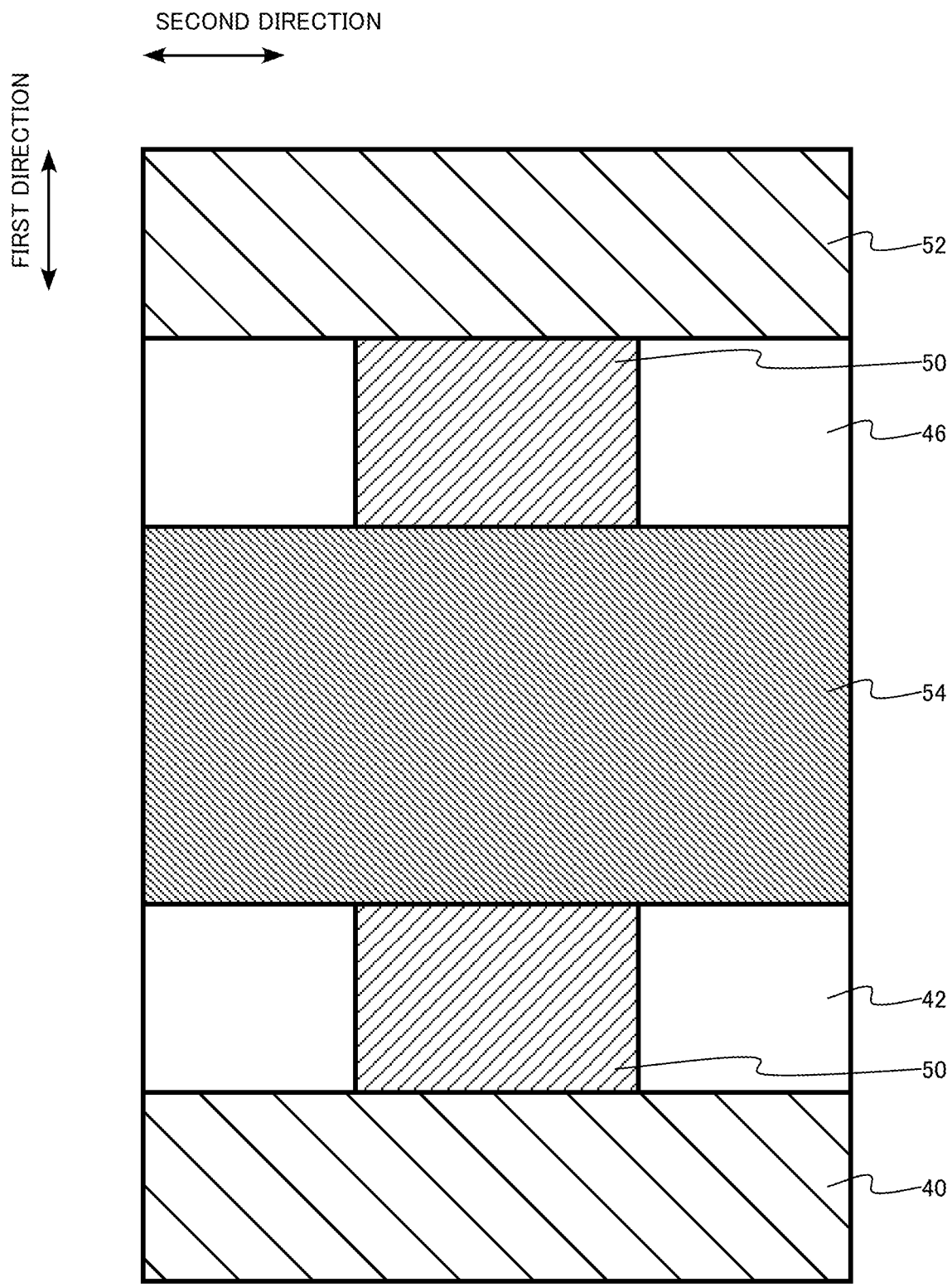
FIG. 10 is a schematic cross-sectional view illustrating an example of a method of manufacturing the semiconductor device of the first embodiment.

Subsequently, a second oxide semiconductor film 54 is formed in a region where a part of the first oxide semiconductor film 50 is removed (FIG. 10). The second oxide semiconductor film 54 is formed by, for example, the CVD method.

Figure 11:
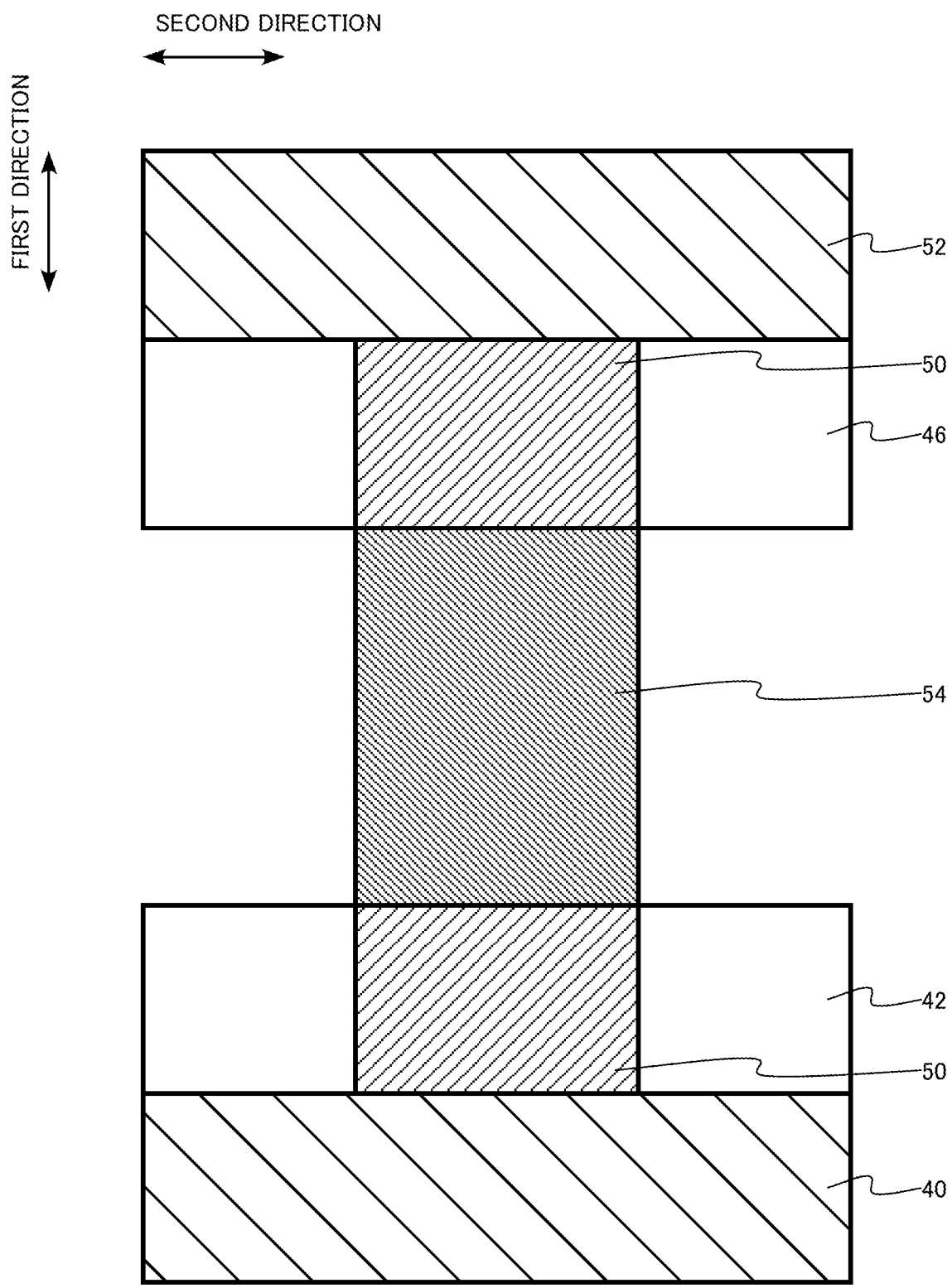
FIG. 11 is a schematic cross-sectional view illustrating the method for manufacturing the semiconductor device of the first embodiment.

Subsequently, a part of the second oxide semiconductor film 54 is removed (FIG. 11). The second oxide semiconductor film 54 is removed by, for example, the wet etching method.

Figure 12:
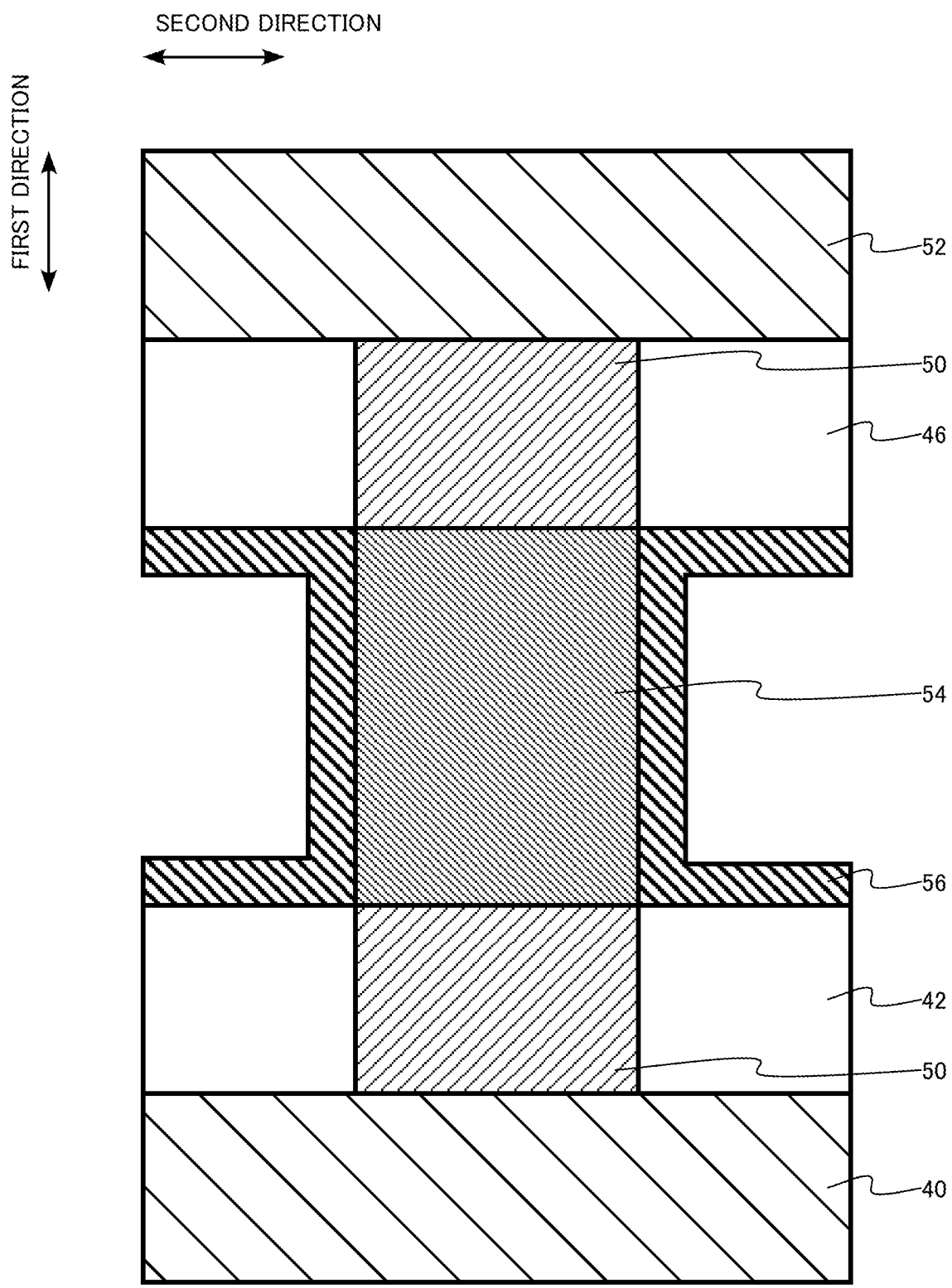
FIG. 12 is a schematic cross-sectional view illustrating the method for manufacturing the semiconductor device of the first embodiment.

Subsequently, a third silicon oxide film 56 is formed on the remaining second oxide semiconductor film 54 (FIG. 12). The third silicon oxide film 56 is formed by, for example, the CVD method. The third silicon oxide film 56 is an example of a fourth insulating film.

Figure 13:
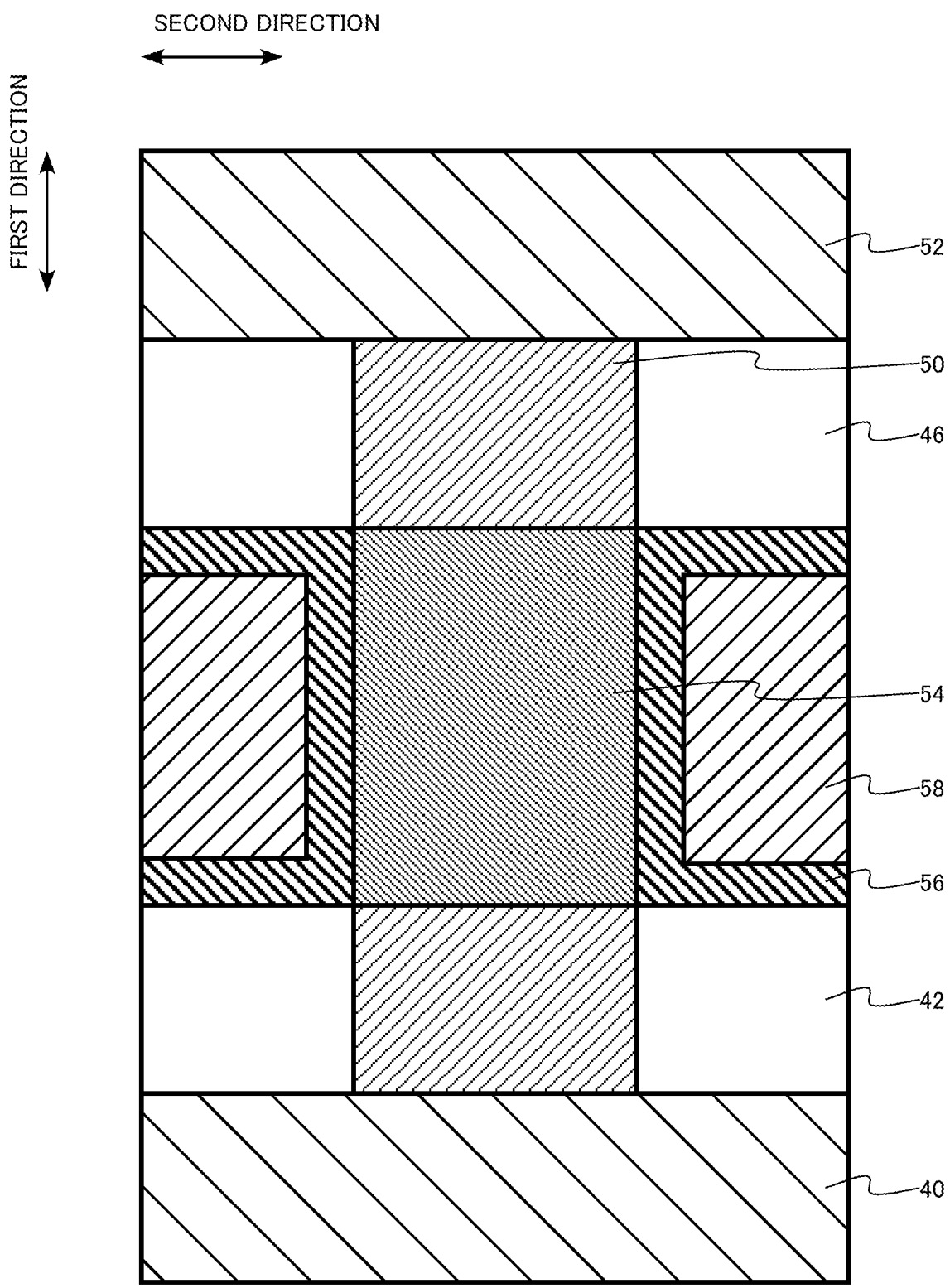
FIG. 13 is a schematic cross-sectional view illustrating the method for manufacturing the semiconductor device of the first embodiment.

Subsequently, a tungsten film 58 is formed on the third silicon oxide film 56 (FIG. 13). The tungsten film 58 is formed by, for example, the CVD method. The tungsten film 58 is an example of a metal film.

The transistor 100 illustrated in FIG. 1 is formed by the above manufacturing method.

Next, functions and effects of the semiconductor device of the first embodiment will be described.

Figure 14:
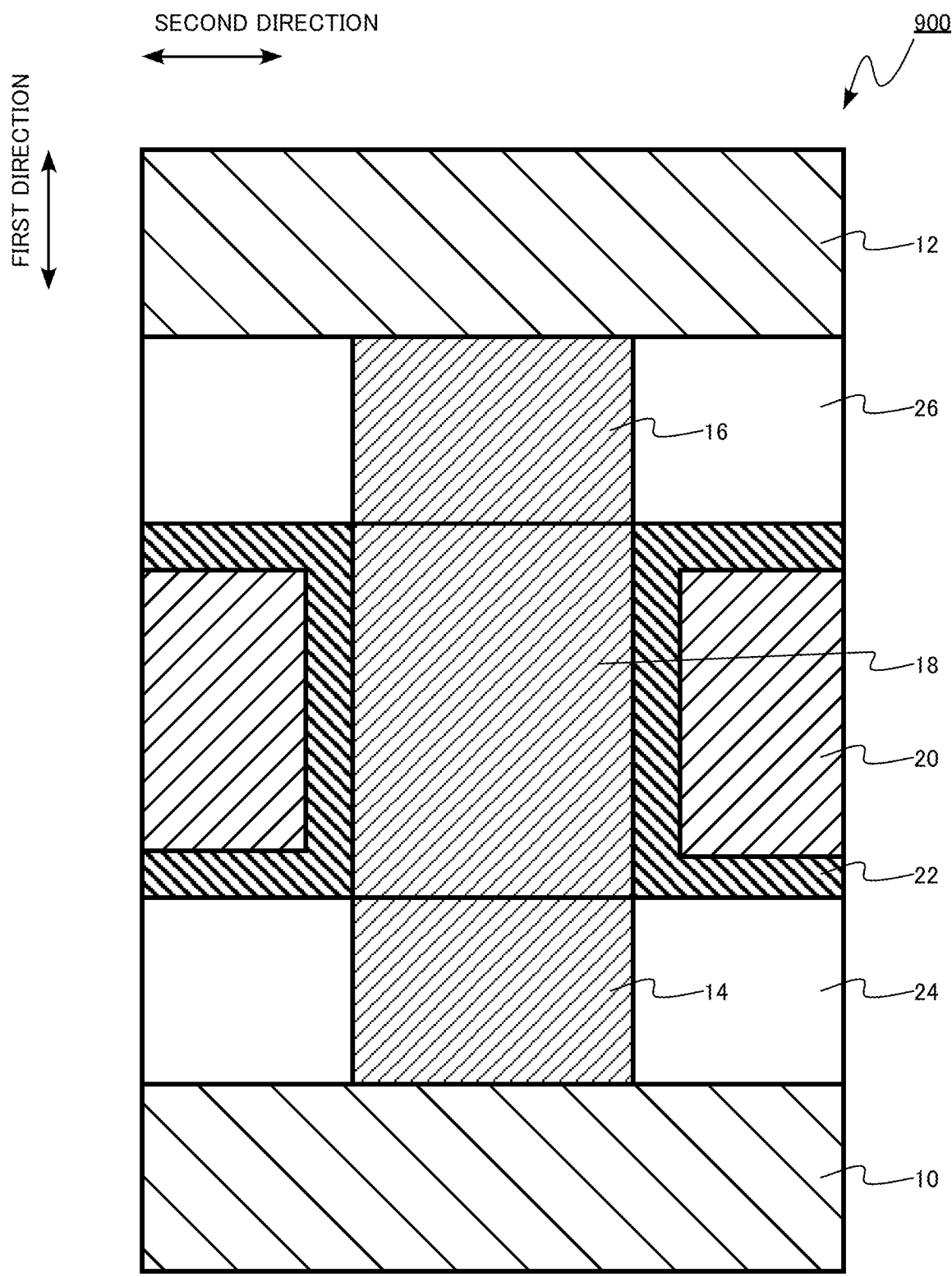
FIG. 14 is a schematic cross-sectional view of a semiconductor device of a comparative example.

FIG. 14 is a schematic cross-sectional view of a semiconductor device according to a comparative example. The semiconductor device according to the comparative example is a transistor 900. The transistor 900 is an oxide semiconductor transistor in which a channel is formed in an oxide semiconductor. A gate electrode of the transistor 900 is a transistor having the GAA structure. The transistor 900 is a vertical transistor.

The transistor 900 is different from the transistor 100 of the first embodiment in that the channel layer 18 has the same chemical composition as the chemical compositions of the source layer 14 and the drain layer 16. The chemical compositions of the source layer 14 and the drain layer 16 are similar to the chemical compositions in the transistor 100 of the first embodiment.

Figure 15:
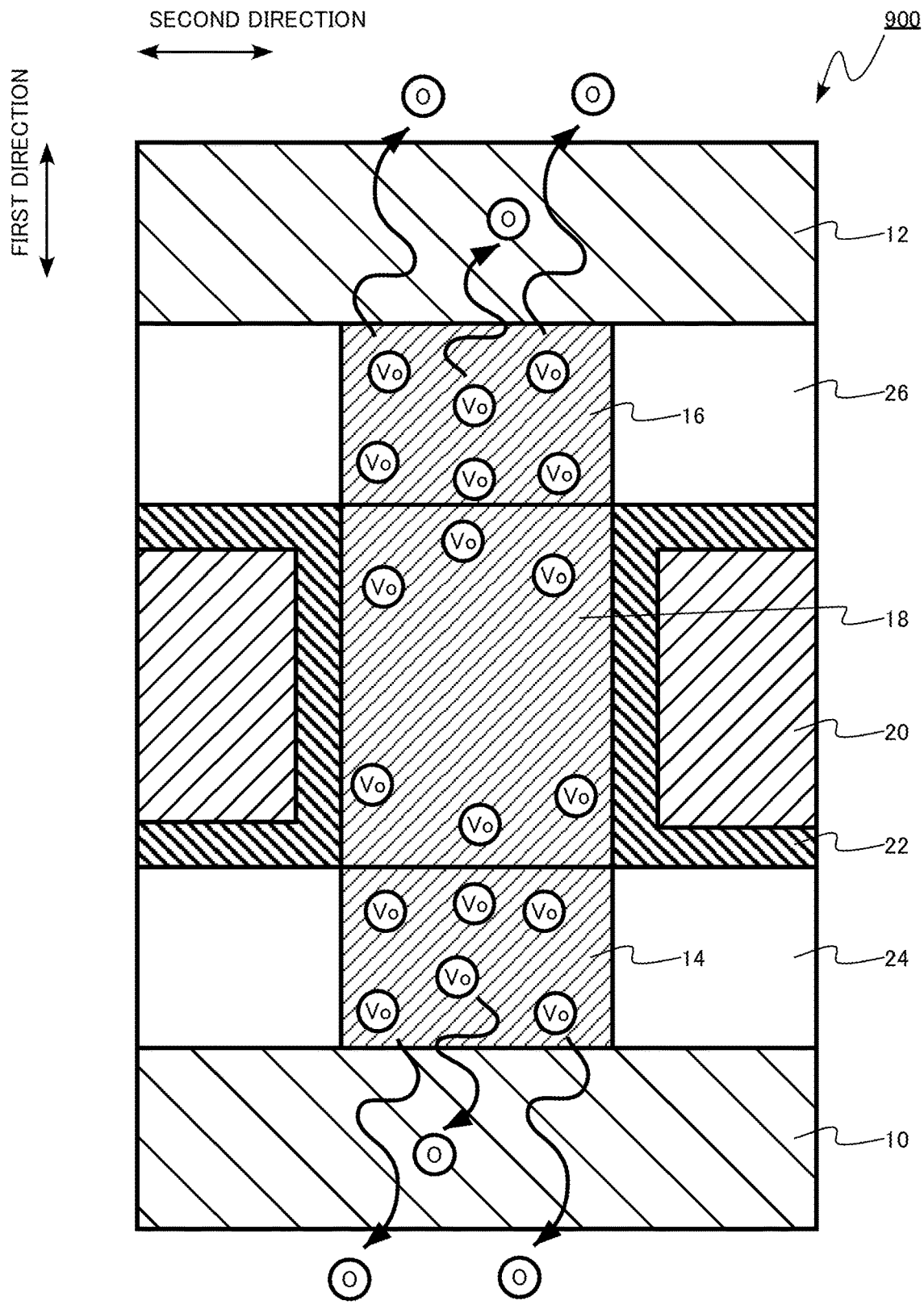
FIG. 15 is an explanatory diagram of a problem of the semiconductor device of the comparative example.

FIG. 15 is an explanatory diagram of a problem of the semiconductor device according to the comparative example. For example, in a case where the transistor 900 according to the comparative example is applied to a switching transistor of a memory cell of a DRAM, a heat treatment accompanying formation of the memory cell and wiring is applied to the transistor 900 after the formation of the transistor structure.

As illustrated in FIG. 15, during the heat treatment, outward diffusion of oxygen from the source layer 14, the drain layer 16, and the channel layer 18 toward the source electrode 10 and the drain electrode 12 occurs. Due to the outward diffusion of oxygen (O), oxygen deficiency (Vo) is formed in the source layer 14, the drain layer 16, and the channel layer 18 after the heat treatment.

The oxygen deficiency functions as a donor in the oxide semiconductor. Thus, when the oxygen deficiency is formed in the source layer 14 and the drain layer 16, the electrical resistance of the source layer 14 and the drain layer 16 decreases. Since a decrease in on-resistance due to a decrease in parasitic resistance of the transistor 900 is caused, the decrease in the electrical resistance of the source layer 14 and the drain layer 16 is desirable.

On the other hand, when the oxygen deficiency is formed in the channel layer 18, an effective channel length of the transistor 900 becomes short, and a threshold voltage decreases. Thus, for example, an off-leak current of the transistor 900 increases. For example, since charge retention characteristics of the memory cell of the DRAM are degraded, the increase in the off-leak current of the transistor 900 is problematic.

Figure 16:
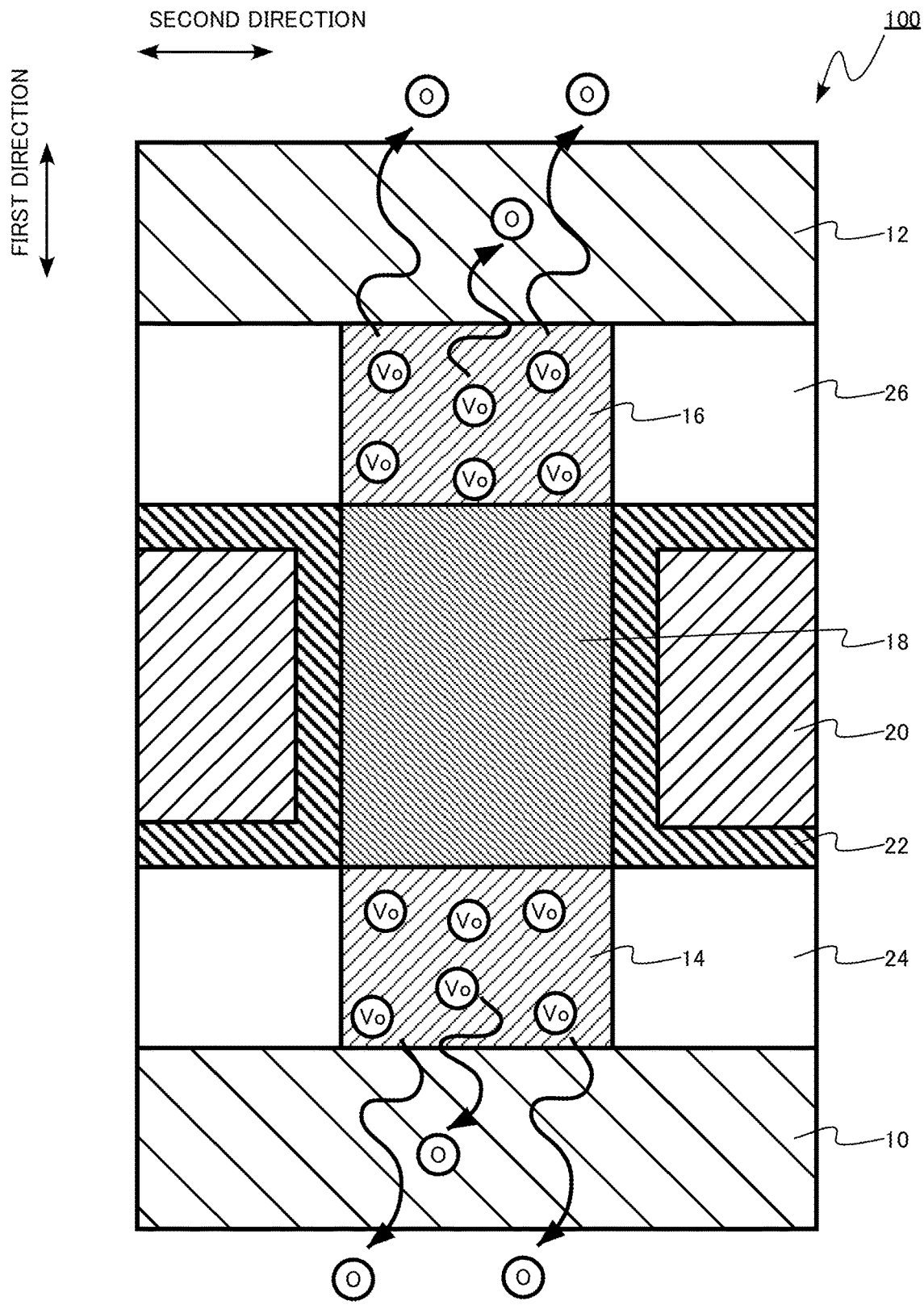
FIG. 16 is an explanatory diagram of functions and effects of the semiconductor device of the first embodiment.

FIG. 16 is an explanatory diagram of the functions and effects of the semiconductor device of the first embodiment.

In the transistor 100 of the first embodiment, the chemical compositions of the source layer 14 and the drain layer 16 are different from the chemical composition of the channel layer 18. The source layer 14 and the drain layer 16 contain the first metal element. The channel layer 18 contains the second metal element.

The first metal element is at least one metal element selected from the group consisting of gallium (Ga), magnesium (Mg), and manganese (Mn). The second metal element is at least one metal element selected from the group consisting of aluminum (Al), hafnium (Hf), lanthanum (La), tin (Sn), tantalum (Ta), titanium (Ti), tungsten (W), yttrium (Y), and zirconium (Zr).

Binding energy of the first metal element with oxygen (O) is lower than binding energy of the second metal element with oxygen (O). In other words, binding energy of the second metal element with oxygen (O) is higher than the binding energy of the first metal element with oxygen (O).

Since the binding energy of the first metal element with oxygen (O) is small, oxygen is easily desorbed in the source layer 14 and the drain layer 16 containing the first metal element during the heat treatment, and the formation of the oxygen deficiency is promoted. Accordingly, as illustrated in FIG. 16, the amount of oxygen deficiency in the source layer 14 and the drain layer 16 increases, and the electrical resistance of the source layer 14 and the drain layer 16 decreases. Therefore, the on-resistance of the transistor 100 decreases.

On the other hand, since the binding energy of the second metal element with oxygen (O) is large, oxygen is hardly desorbed and the formation of the oxygen deficiency is suppressed in the channel layer 18 containing the second metal element during the heat treatment. Accordingly, as illustrated in FIG. 16, the amount of oxygen deficiency in the channel layer 18 decreases, and the decrease in the threshold voltage of the transistor 100 is suppressed.

In accordance with the transistor 100 of the first embodiment, the on-resistance decreases, and the decrease in the threshold voltage is suppressed. The transistor 100 of the first embodiment has high heat resistance.

From the viewpoint of suppressing the decrease in the threshold voltage of the transistor 100, the atomic concentration of the first metal element in the channel layer 18 is preferably lower than the atomic concentration of the first metal element in the source layer 14. From the viewpoint of suppressing the decrease in the threshold voltage of the transistor 100, the atomic concentration of the first metal element in the channel layer 18 is more preferably equal to or less than $\frac{1}{10}$ of the atomic concentration of the first metal element in the source layer 14, and still more preferably equal to or less than $\frac{1}{100}$.

From the viewpoint of suppressing the decrease in the threshold voltage of the transistor 100, the atomic concentration of the second metal element in the channel layer 18 is preferably higher than the atomic concentration of the second metal element in the source layer 14. From the viewpoint of suppressing the decrease in the threshold voltage of the transistor 100, the atomic concentration of the second metal element in the channel layer 18 is more preferably equal to or more than 10 times the atomic concentration of the second metal element in the source layer 14, still more preferably equal to or more than 100 times.

From the viewpoint of suppressing the decrease in the threshold voltage of the transistor 100, for example, the length (d1 in FIG. 1) of the channel layer 18 in the first direction is preferably larger than the length (d2 in FIG. 1) of the gate electrode 20 in the first direction. From the viewpoint of suppressing the decrease in the threshold voltage of the transistor 100, the boundary B1 between the source layer 14 and the channel layer 18 is preferably disposed closer to the source electrode 10 than the gate electrode 20 in the first direction, and the boundary B2 between the drain layer 16 and the channel layer 18 is preferably disposed closer to the drain electrode 12 than the gate electrode 20 in the first direction. The effective channel length of the transistor 100 increases, and the decrease in the threshold voltage of the transistor 100 is suppressed.

First Modification Example

Figure 17:
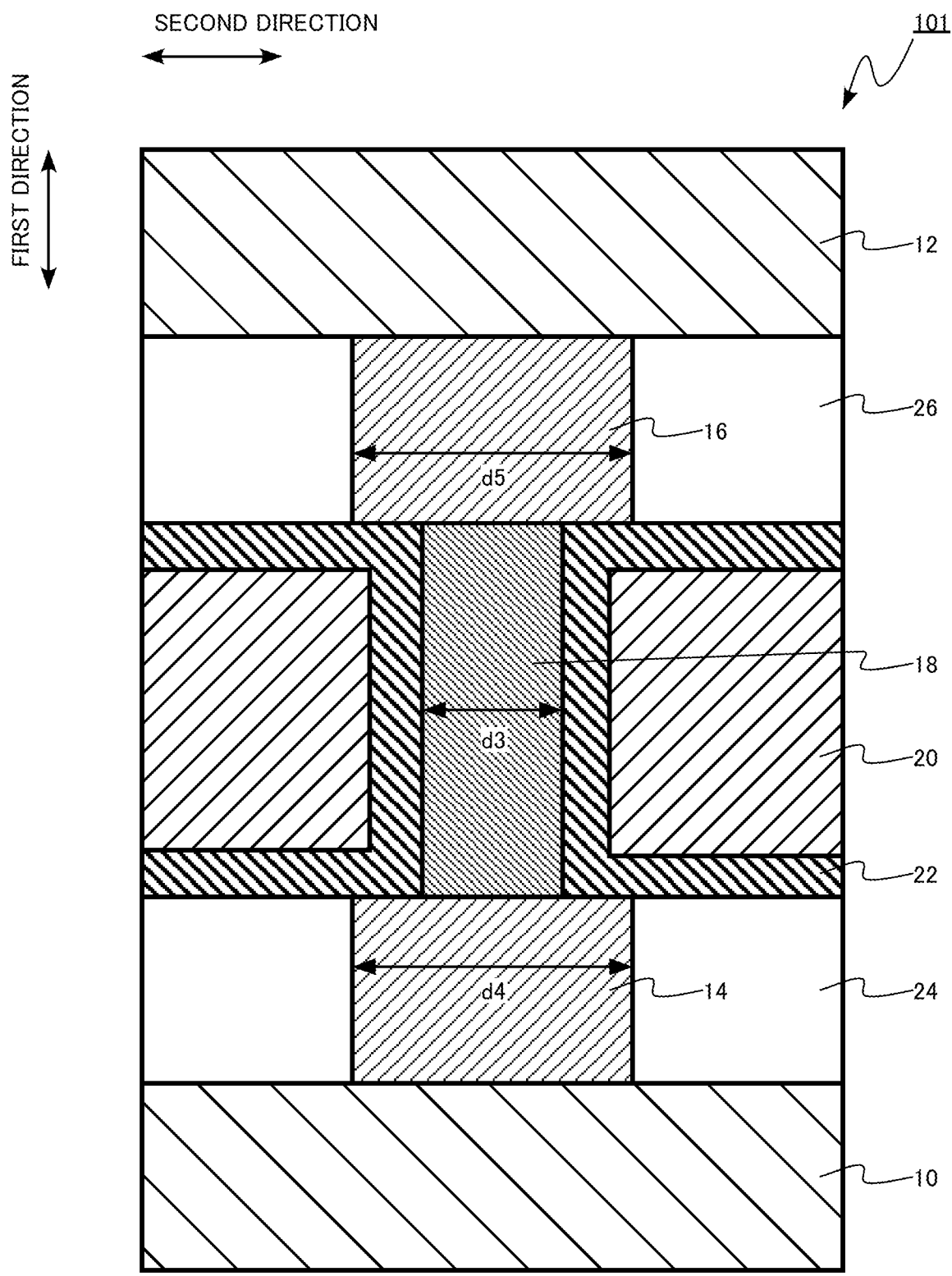
FIG. 17 is a schematic cross-sectional view of a first modification example of the semiconductor device of the first embodiment.

FIG. 17 is a schematic cross-sectional view of a first modification example of the semiconductor device of the first embodiment. The semiconductor device according to the first modification example is a transistor 101.

The transistor 101 of the first modification example is different from the transistor 100 of the first embodiment in that a length (d3 in FIG. 17) of the channel layer 18 in the second direction perpendicular to the first direction is smaller than a length (d4 in FIG. 17) of the source layer 14 in the second direction. The transistor 101 is different from the transistor 100 in that the length (d3 in FIG. 17) of the channel layer 18 in the second direction is smaller than a length (d5 in FIG. 17) of the drain layer 16 in the second direction.

The transistor 101 of the first modification example can be formed by increasing the etching amount during the removing of the second oxide semiconductor film 54 illustrated in FIG. 11 in the manufacturing method of the first embodiment.

In the transistor 101 according to the first modification example, for example, the length d3 of the channel layer 18 in the second direction is small, and thus, dominant force of a gate voltage applied to the gate electrode 20 on the channel layer 18 is improved. Accordingly, for example, cutoff characteristics of the transistor 101 are improved, and the off-leak current decreases.

Second Modification Example

Figure 18:
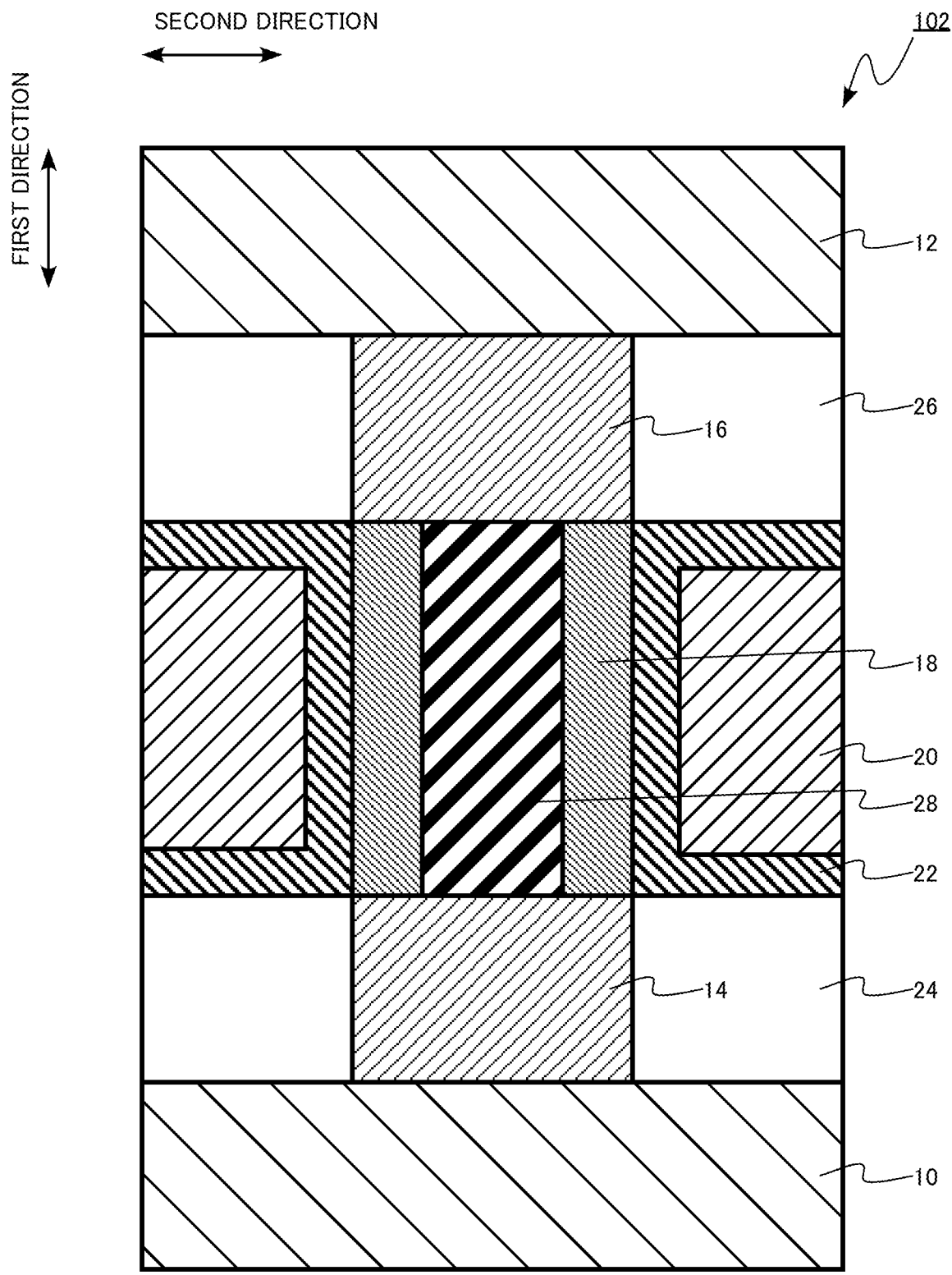
FIG. 18 is a schematic cross-sectional view of a second modification example of the semiconductor device of the first embodiment.

FIG. 18 is a schematic cross-sectional view of a second modification example of the semiconductor device of the first embodiment. The semiconductor device according to the second modification example is a transistor 102.

The transistor 102 of the second modification example is different from the transistor 100 of the first embodiment in that the transistor further includes a core insulating layer 28.

The core insulating layer 28 is provided between the source layer 14 and the drain layer 16. The core insulating layer 28 is surrounded by the channel layer 18.

For example, a thickness of the channel layer 18 in the second direction decreases by providing the core insulating layer 28. Accordingly, the dominant force of the gate voltage applied to the gate electrode 20 on the channel layer 18 is improved. Accordingly, for example, the cutoff characteristics of the transistor 102 are improved, and the off-leak current decreases.

As described above, in accordance with the first embodiment and the modification examples thereof, it is possible to provide a transistor having high heat resistance and a method for manufacturing the transistor.

Second Embodiment

A semiconductor memory device of a second embodiment includes a first wiring extending in a first direction, a second wiring extending in a second direction intersecting the first direction, and a memory cell including a transistor and a capacitor. The transistor includes a first electrode electrically connected to the first wiring, a second electrode electrically connected to the capacitor, a first oxide semiconductor layer provided between the first electrode and the second electrode, the first oxide semiconductor layer containing indium (In), zinc (Zn), and a first metal element, and the first metal element being at least one metal element selected from the group consisting of gallium (Ga), magnesium (Mg), and manganese (Mn), a second oxide semiconductor layer provided between the first oxide semiconductor layer and the second electrode, the second oxide semiconductor layer containing indium (In), zinc (Zn), and the first metal element, a third oxide semiconductor layer provided between the first oxide semiconductor layer and the second oxide semiconductor layer, the third oxide semiconductor layer having a chemical composition different from chemical compositions of the first oxide semiconductor layer and the second oxide semiconductor layer, the third oxide semiconductor layer containing indium (In), zinc (Zn), and a second metal element, and the second metal element being at least one metal element selected from the group consisting of aluminum (Al), hafnium (Hf), lanthanum (La), tin (Sn), tantalum (Ta), titanium (Ti), tungsten (W), yttrium (Y), and zirconium (Zr), a gate electrode facing the third oxide semiconductor layer, and a gate insulating layer provided between the third oxide semiconductor layer and the gate electrode. Hereinafter, a part of contents overlapping the contents of the first embodiment will not be described.

The semiconductor memory device of the second embodiment is a semiconductor memory 200. The semiconductor memory device of the second embodiment is a DRAM. The semiconductor memory 200 uses the transistor 100 of the first embodiment as the switching transistor of the memory cell of the DRAM.

Figure 19:
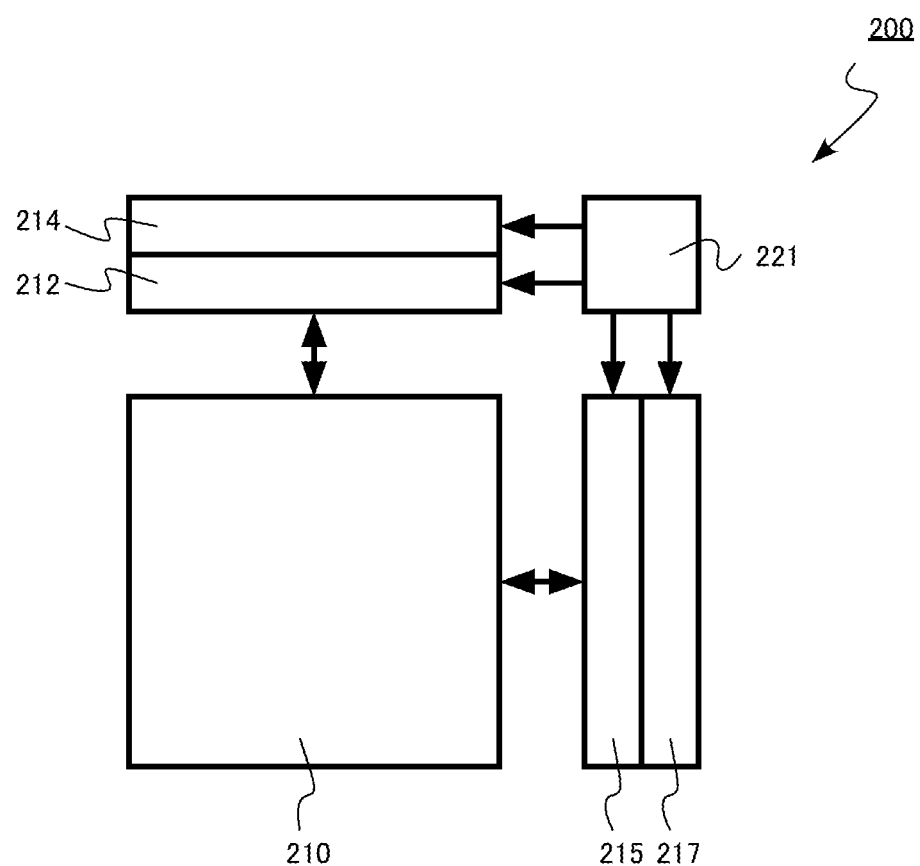
FIG. 19 is a block diagram of a semiconductor memory device of a second embodiment.

FIG. 19 is a block diagram of the semiconductor memory device of the second embodiment.

As illustrated in FIG. 19, the semiconductor memory 200 includes a memory cell array 210, a word line driver circuit 212, a row decoder circuit 214, a sense amplifier circuit 215, a column decoder circuit 217, and a control circuit 221.

Figure 20:
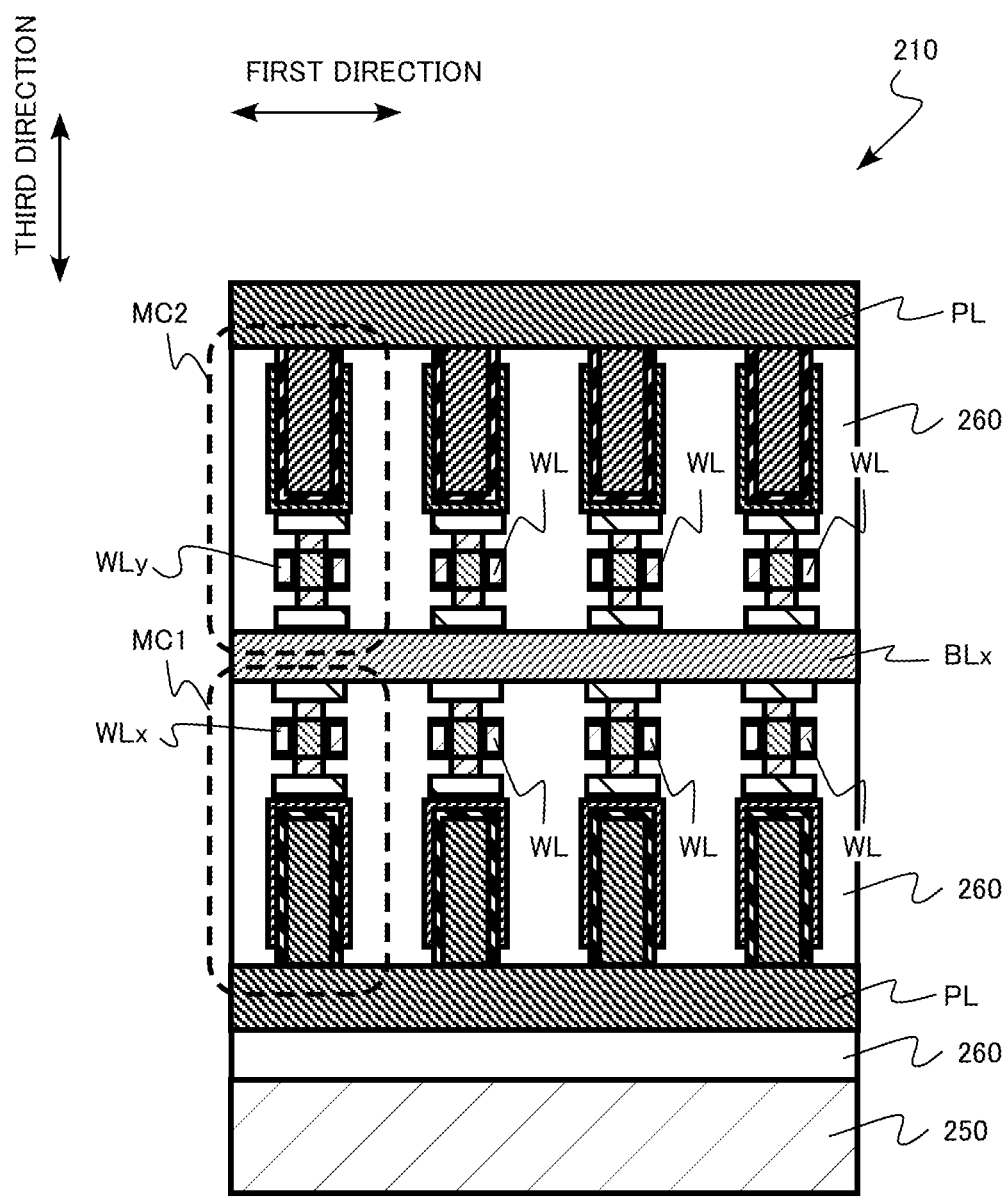
FIG. 20 is a schematic cross-sectional view of a memory cell array of the semiconductor memory device of the second embodiment.
Figure 21:
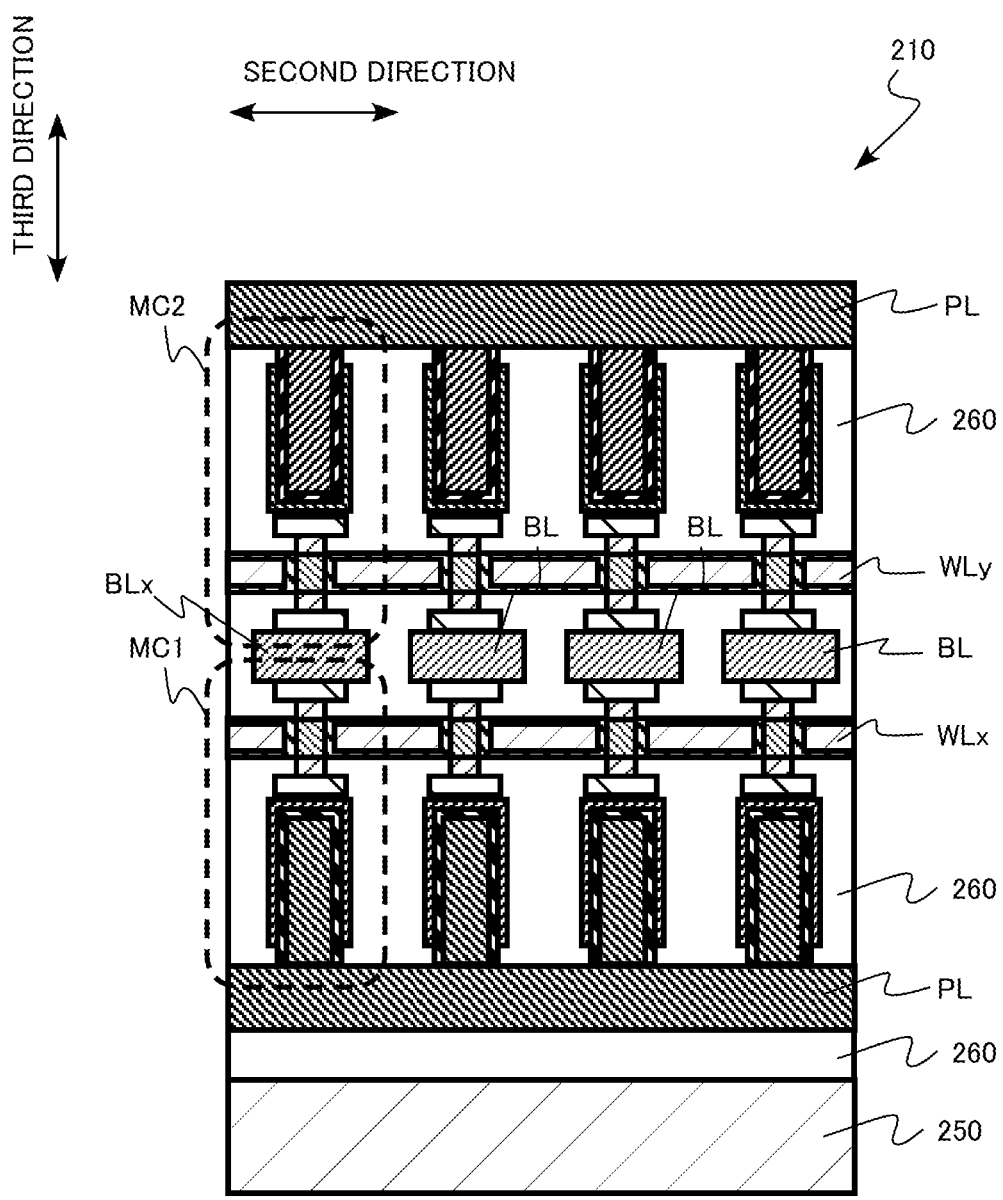
FIG. 21 is a schematic cross-sectional view of the memory cell array of the semiconductor memory device of the second embodiment.

FIGS. 20 and 21 are schematic cross-sectional views of the memory cell array of the semiconductor memory device of the second embodiment. FIG. 20 is a cross-sectional view of a plane including the first direction and a third direction, and FIG. 21 is a cross-sectional view of a plane including the second direction and the third direction. The first direction intersects the second direction. The first direction is, for example, perpendicular to the second direction. The third direction is a direction perpendicular to the first direction and the second direction. The third direction is, for example, a direction perpendicular to the substrate.

The memory cell array 210 of the second embodiment has a three-dimensional structure in which memory cells are three-dimensionally disposed. In FIGS. 20 and 21, each region surrounded by a broken line represents one memory cell.

The memory cell array 210 includes a silicon substrate 250.

The memory cell array 210 includes, for example, a plurality of bit lines BL and a plurality of word lines WL on the silicon substrate 250. The bit lines BL extend in the first direction. The word lines WL extend in the second direction.

The bit lines BL and the word lines WL intersect vertically, for example. The memory cells are disposed in regions where the bit lines BL and the word lines WL intersect. The memory cells include first memory cells MC1 and second memory cells MC2. The first memory cells MC1 and the second memory cells MC2 are examples of the memory cells.

The bit lines BL connected to the first memory cells MC1 and the second memory cells MC2 are bit lines BLx. The bit lines BLx are examples of first wirings.

The word lines WL connected to the first memory cells MC1 are word lines WLx. The word lines WLx are examples of second wirings. The word lines WL connected to the second memory cells MC2 are word lines WLy. The word lines WLx are provided on one side of the bit lines BLx. The word lines WLy are provided on the other side of the bit lines BLx.

The memory cell array 210 includes a plurality of plate electrode lines PL. The plate electrode lines PL are connected to a plate electrode 72 of each memory cell.

The memory cell array 210 includes an interlayer insulating layer 260 for electrical separation of each wiring and each electrode.

The plurality of word lines WL are electrically connected to the row decoder circuit 214. The plurality of bit lines BL are electrically connected to the sense amplifier circuit 215.

The row decoder circuit 214 has a function of selecting the word line WL according to an input row address signal. The word line driver circuit 212 has a function of applying a predetermined voltage to the word line WL selected by the row decoder circuit 214.

The column decoder circuit 217 has a function of selecting the bit line BL according to an input column address signal. The sense amplifier circuit 215 has a function of applying a predetermined voltage to the bit line BL selected by the column decoder circuit 217. The sense amplifier circuit has a function of detecting and amplifying the electric potential of the bit line BL.

The control circuit 221 has a function of controlling the word line driver circuit 212, the row decoder circuit 214, the sense amplifier circuit 215, the column decoder circuit 217, and other circuits (not illustrated).

The circuits such as the word line driver circuit 212, the row decoder circuit 214, the sense amplifier circuit 215, the column decoder circuit 217, and the control circuit 221 are constituted by, for example, transistors and wiring layers (not illustrated). The transistor is formed by using, for example, the silicon substrate 250.

The bit lines BL and the word lines WL are conductors. The bit lines FL and the word lines WL are, for example, metal.

Figure 22:
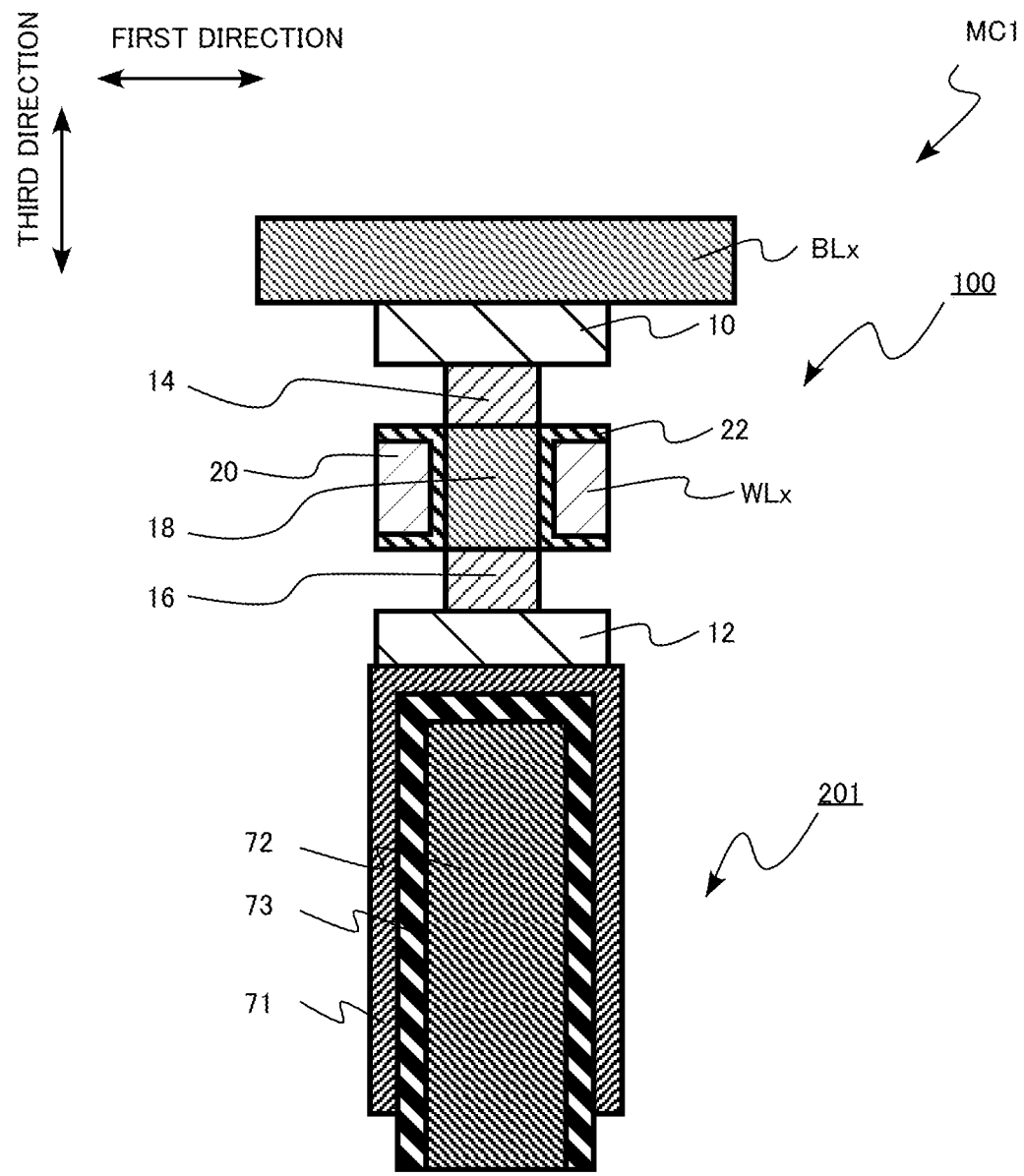
FIG. 22 is a schematic cross-sectional view of a first memory cell of the semiconductor memory device of the second embodiment.
Figure 23:
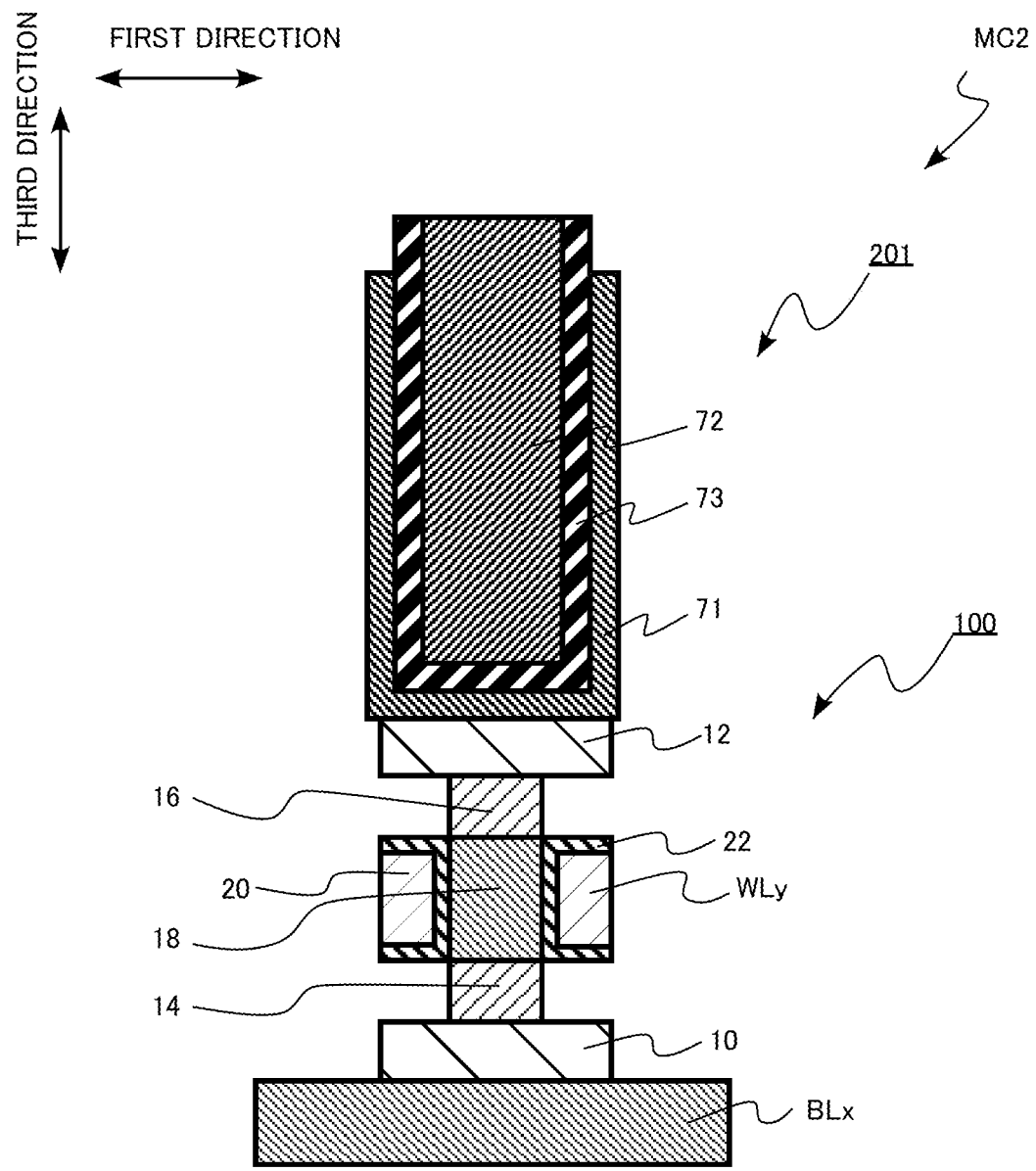
FIG. 23 is a schematic cross-sectional view of a second memory cell of the semiconductor memory device of the second embodiment.

FIG. 22 is a schematic cross-sectional view of the first memory cell of the semiconductor memory device of the second embodiment. FIG. 23 is a schematic cross-sectional view of the second memory cell of the semiconductor memory device of the second embodiment.

The first memory cell MC1 is provided between the silicon substrate 250 and the bit line BLx. The bit line BLx is provided between the silicon substrate 250 and the second memory cell MC2.

The first memory cell MC1 is provided below the bit line BLx. The second memory cell MC2 is provided above the bit line BLx.

The first memory cell MC1 is provided on one side of the bit line BLx. The second memory cell MC2 is provided on the other side of the bit line BLx.

Each of the first memory cell MC1 and the second memory cell MC2 includes a transistor 100 and a capacitor 201.

The transistor 100 includes a source electrode 10, a drain electrode 12, a source layer 14, a drain layer 16, a channel layer 18, a gate electrode 20, and a gate insulating layer 22. The source electrode 10 is an example of a first electrode. The drain electrode 12 is an example of a second electrode. The source layer 14 is an example of a first oxide semiconductor layer. The drain layer 16 is an example of a second oxide semiconductor layer. The channel layer 18 is an example of a third oxide semiconductor layer.

For example, a length of the channel layer 18 in the third direction is larger than a length of the gate electrode 20 in the third direction.

For example, the boundary between the source layer 14 and the channel layer 18 is disposed closer to the source electrode 10 than the gate electrode 20 in the third direction. For example, the boundary between the drain layer 16 and the channel layer 18 is disposed closer to the drain electrode 12 than the gate electrode 20 in the third direction.

The word line WLx is electrically connected to the gate electrode 20 of the first memory cell MC1. The word line WLy is electrically connected to the gate electrode 20 of the second memory cell MC2.

The capacitor 201 includes a cell electrode 71, the plate electrode 72, and a capacitor insulating film 73. The cell electrode 71 and the plate electrode 72 are, for example, titanium nitride. The capacitor insulating film 73 has, for example, a stacked structure of zirconium oxide, aluminum oxide, and zirconium oxide.

In the first memory cell MC1, the capacitor 201 is electrically connected to the drain electrode 12. The cell electrode 71 of the capacitor 201 is connected to the drain electrode 12. The plate electrode 72 is connected to the plate electrode line PL. In the first memory cell MC1, the bit line BLx is electrically connected to the source electrode 10.

In the second memory cell MC2, the capacitor 201 is electrically connected to the drain electrode 12. The cell electrode 71 of the capacitor 201 is connected to the drain electrode 12. The plate electrode 72 is connected to the plate electrode line PL. In the second memory cell MC2, the bit line BLx is electrically connected to the source electrode 10.

FIGS. 20, 21, 22, and 23 illustrate an example in which the word line WL and the gate electrode 20 are simultaneously made of the same material. The word line WL and the gate electrode 20 may be separately made of different materials.

FIGS. 20, 21, 22, and 23 illustrate an example in which the bit line BL and the source electrode 10 are separately made of different materials. The bit line BL and the source electrode 10 may be simultaneously made of the same material.

In accordance with the second embodiment, the transistor 100 of the first embodiment is used as the switching transistor of the DRAM, and thus, the decrease in the threshold voltage after the heat treatment is suppressed. Accordingly, the semiconductor memory having high heat resistance is realized.

In the first embodiment, although it has been described that the GAA structure in which the gate electrode 20 surrounds the channel layer 18 has been described, the gate electrode 20 may not surround the channel layer 18.

While certain embodiments have been described, these embodiments have been presented by way of example only, and are not intended to limit the scope of the inventions. Indeed, the semiconductor device, the semiconductor memory device, and the method for manufacturing the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor device comprising:
a first electrode;
a second electrode;
a first oxide semiconductor layer provided between the first electrode and the second electrode, the first oxide semiconductor layer containing indium (In), zinc (Zn), and a first metal element, and the first metal element being at least one metal element selected from the group consisting of gallium (Ga), magnesium (Mg), and manganese (Mn);

a second oxide semiconductor layer provided between the first oxide semiconductor layer and the second electrode, the second oxide semiconductor layer containing indium (In), zinc (Zn), and the first metal element;

a third oxide semiconductor layer provided between the first oxide semiconductor layer and the second oxide semiconductor layer, the third oxide semiconductor layer having a chemical composition different from chemical compositions of the first oxide semiconductor layer and the second oxide semiconductor layer, the third oxide semiconductor layer containing indium (In), zinc (Zn), and a second metal element, the second metal element being at least one metal element selected from the group consisting of aluminum (Al), hafnium (Hf), lanthanum (La), tin (Sn), tantalum (Ta), titanium (Ti), tungsten (W), yttrium (Y), and zirconium (Zr);

a gate electrode facing the third oxide semiconductor layer; and a gate insulating layer provided between the third oxide semiconductor layer and the gate electrode.

2. The semiconductor device according to claim 1, wherein an atomic concentration of the first metal element in the third oxide semiconductor layer is lower than an atomic concentration of the first metal element in the first oxide semiconductor layer, and the atomic concentration of the first metal element in the third oxide semiconductor layer is lower than an atomic concentration of the first metal element in the second oxide semiconductor layer.

3. The semiconductor device according to claim 1, wherein an atomic concentration of the second metal element in the third oxide semiconductor layer is higher than an atomic concentration of the second metal element in the first oxide semiconductor layer, and the atomic concentration of the second metal element in the third oxide semiconductor layer is higher than an atomic concentration of the second metal element in the second oxide semiconductor layer.

4. The semiconductor device according to claim 1, wherein a length of the third oxide semiconductor layer in a first direction from the first electrode toward the second electrode is larger than a length of the gate electrode in the first direction.

5. The semiconductor device according to claim 1, wherein a distance between the first electrode and a boundary between the first oxide semiconductor layer and the third oxide semiconductor layer in a first direction from the first electrode toward the second electrode is smaller than a distance between the first electrode and the gate electrode in the first direction, and a distance between the second electrode and a boundary between the second oxide semiconductor layer and the third oxide semiconductor layer in the first direction is smaller than a distance between the second electrode and the gate electrode in the first direction.

6. The semiconductor device according to claim 1, wherein a length of the third oxide semiconductor layer in a second direction perpendicular to a first direction from the first electrode toward the second electrode is smaller than a length of the first oxide semiconductor layer in the second direction, and the length of the third oxide semiconductor layer in the second direction is smaller than a length of the second oxide semiconductor layer in the second direction.

7. The semiconductor device according to claim 1, wherein the gate electrode surrounds the third oxide semiconductor layer.

8. A semiconductor memory device comprising:

a first wiring extending in a first direction;

a second wiring extending in a second direction intersecting the first direction; and a memory cell including a transistor and a capacitor, wherein the transistor includes a first electrode electrically connected to the first wiring, a second electrode electrically connected to the capacitor, a first oxide semiconductor layer provided between the first electrode and the second electrode, the first oxide semiconductor layer containing indium (In), zinc (Zn), and a first metal element, and the first metal element being at least one metal element selected from the group consisting of gallium (Ga), magnesium (Mg), and manganese (Mn), a second oxide semiconductor layer provided between the first oxide semiconductor layer and the second electrode, the second oxide semiconductor layer containing indium (In), zinc (Zn), and the first metal element, a third oxide semiconductor layer provided between the first oxide semiconductor layer and the second oxide semiconductor layer, the third oxide semiconductor layer having a chemical composition different from chemical compositions of the first oxide semiconductor layer and the second oxide semiconductor layer, the third oxide semiconductor layer containing indium (In), zinc (Zn), and a second metal element, and the second metal element being at least one metal element selected from the group consisting of aluminum (Al), hafnium (Hf), lanthanum (La), tin (Sn), tantalum (Ta), titanium (Ti), tungsten (W), yttrium (Y), and zirconium (Zr);

a gate electrode facing the third oxide semiconductor layer; and a gate insulating layer provided between the third oxide semiconductor layer and the gate electrode.

9. The semiconductor memory device according to claim 8, wherein an atomic concentration of the first metal element in the third oxide semiconductor layer is lower than an atomic concentration of the first metal element in the first oxide semiconductor layer, and the atomic concentration of the first metal element in the third oxide semiconductor layer is lower than an atomic concentration of the first metal element in the second oxide semiconductor layer.

10. The semiconductor memory device according to claim 8, wherein an atomic concentration of the second metal element in the third oxide semiconductor layer is higher than an atomic concentration of the second metal element in the first oxide semiconductor layer, and the atomic concentration of the second metal element in the third oxide semiconductor layer is higher than an atomic concentration of the second metal element in the second oxide semiconductor layer.

11. The semiconductor memory device according to claim 8, wherein a length of the third oxide semiconductor layer in a third direction perpendicular to the first direction and the second direction is larger than a length of the gate electrode in the third direction.

12. The semiconductor memory device according to claim 8, wherein
- a distance between the first electrode and a boundary between the first oxide semiconductor layer and the third oxide semiconductor layer in a third direction perpendicular to the first direction and the second direction is smaller than a distance between the first electrode and the gate electrode in the third direction, and
- a distance between the second electrode and a boundary between the second oxide semiconductor layer and the third oxide semiconductor layer is smaller than a distance between the second electrode and the gate electrode in the third direction.

13. The semiconductor memory device according to claim 8, wherein
- a length of the third oxide semiconductor layer in the first direction is smaller than a length of the first oxide semiconductor layer in the first direction, and
- the length of the third oxide semiconductor layer in the first direction is smaller than a length of the second oxide semiconductor layer in the first direction.

14. The semiconductor memory device according to claim 8, wherein the gate electrode surrounds the third oxide semiconductor layer.

\* \* \* \* \*